US011433425B2

(12) United States Patent
Nakata et al.

(10) Patent No.: US 11,433,425 B2
(45) Date of Patent: Sep. 6, 2022

(54) ACTUATOR, DRIVING MEMBER, TACTILE SENSE PRESENTING DEVICE, AND DRIVING DEVICE

(71) Applicant: Sony Corporation, Tokyo (JP)

(72) Inventors: Akihiro Nakata, Kanagawa (JP); Satoshi Nakamaru, Kanagawa (JP); Yoshio Goto, Kanagawa (JP); Hiroichi Ishikawa, Tokyo (JP); Kentarou Sakai, Kanagawa (JP); Kazuhito Wakana, Kanagawa (JP)

(73) Assignee: Sony Corporation, Tokyo (JP)

( * ) Notice: Subject to any disclaimer, the term of this patent is extended or adjusted under 35 U.S.C. 154(b) by 435 days.

(21) Appl. No.: 16/612,281

(22) PCT Filed: May 2, 2018

(86) PCT No.: PCT/JP2018/017547
§ 371 (c)(1),
(2) Date: Nov. 8, 2019

(87) PCT Pub. No.: WO2018/207707
PCT Pub. Date: Nov. 15, 2018

(65) Prior Publication Data
US 2021/0146401 A1 May 20, 2021

(30) Foreign Application Priority Data
May 10, 2017 (JP) .............................. JP2017-093772

(51) Int. Cl.
*B06B 1/06* (2006.01)
*G08B 6/00* (2006.01)
(Continued)

(52) U.S. Cl.
CPC .............. *B06B 1/0603* (2013.01); *G08B 6/00* (2013.01); *H01L 41/0472* (2013.01);
(Continued)

(58) Field of Classification Search
CPC . B06B 1/0603; H01L 41/0472; H01L 41/053; H01L 41/0836; H01L 41/0973; H01L 41/193; H01L 41/047
See application file for complete search history.

(56) References Cited

U.S. PATENT DOCUMENTS 7,038,357 B2    5/2006   Goldenberg et al.
2004/0217671 A1*  11/2004  Rosenthal ................. F01L 1/46
                                                              310/328

(Continued)

FOREIGN PATENT DOCUMENTS

CN    107155299 A  *  9/2017  ............. A61F 2/915
JP    2003-506858 A    2/2003
(Continued)

OTHER PUBLICATIONS

International Search Report and Written Opinion issued in connection with PCT Application No. PCT/JP2018/017547, dated Jul. 17, 2018. (13 pages).

*Primary Examiner* — J. San Martin
(74) *Attorney, Agent, or Firm* — K&L Gates LLP

(57) ABSTRACT

An actuator includes a laminate including an elastomer layer and an electrode, in which the laminate has a spiral or concentric shape, pre-distortion is applied to at least one member out of the elastomer layer and the electrode, and area distortion of the at least one member is 10% or larger.

20 Claims, 15 Drawing Sheets

(51) Int. Cl.
  *H01L 41/047* (2006.01)
  *H01L 41/053* (2006.01)
  *H01L 41/08* (2006.01)
  *H01L 41/083* (2006.01)
  *H01L 41/09* (2006.01)
  *H01L 41/193* (2006.01)

(52) U.S. Cl.
  CPC .......... *H01L 41/053* (2013.01); *H01L 41/082* (2013.01); *H01L 41/0836* (2013.01); *H01L 41/0973* (2013.01); *H01L 41/193* (2013.01)

(56) References Cited

U.S. PATENT DOCUMENTS

2009/0085444 A1   4/2009  Alvarez et al.
2019/0003905 A1*  1/2019  Yoshida .............. H01L 41/1132

FOREIGN PATENT DOCUMENTS

| JP | 2006-520180 A | 8/2006 | |
| JP | 2008-277729 | 11/2008 | |
| JP | 2010-500895 A | 1/2010 | |
| JP | 2012-520516 A | 9/2012 | |
| JP | 2014-509961 A | 4/2014 | |
| JP | 2015-115078 A | 6/2015 | |
| WO | WO-2017111108 A1 * | 6/2017 | ........... H01L 41/193 |

* cited by examiner

A

B

A

B

C

A

B

A                    B

A

B

ACTUATOR, DRIVING MEMBER, TACTILE SENSE PRESENTING DEVICE, AND DRIVING DEVICE

TECHNICAL FIELD

The present technology relates to an actuator, a driving member, a tactile sense presenting device, and a driving device.

BACKGROUND ART

In recent years, it is desired to make a dielectric elastomer actuator thin. For example, Patent Document 1 discloses a technology of achieving a thin elastomer while controlling a movement direction thereof by applying pre-distortion to the elastomer.

CITATION LIST

Patent Document

Patent Document 1: PCT Japanese Translation Patent Publication No. 2003-506858

SUMMARY OF THE INVENTION

Problems to be Solved by the Invention

An object of the present technology is to provide a thin actuator, a driving member provided with the same, a tactile sense presenting device, and a driving device.

Solutions to Problems

In order to solve the above-described problem, a first technology is an actuator including a laminate including an elastomer layer and an electrode, in which the laminate has a spiral or concentric shape, pre-distortion is applied to at least one member out of the elastomer layer and the electrode, and area distortion of the at least one member is 10% or larger.

A second technology is a driving member including a plurality of the actuators.

A third technology is a tactile sense presenting device including the actuator.

A fourth technology is a driving device including the actuator.

Effects of the Invention

According to the present technology, a thin actuator may be realized. Note that, the effects herein described are not necessarily limited and may be any of the effects described in the present disclosure or other effects.

MODE FOR CARRYING OUT THE INVENTION

Embodiments and application examples of the present technology are described in the following order.

1 First Embodiment (Example of Actuator)
2 Second Embodiment (Example of Actuator)
3 Third Embodiment (Example of Actuator)
4 Application Example (Example of Tactile Sense Presenting Device)
5 Application Example (Example of Tactile Sense Presenting Device)

6 Application Example (Example of Linear Driving Device)

7 Application Example (Example of Joint Driving Device)

1 First Embodiment

Configuration of Actuator

Figure 1:
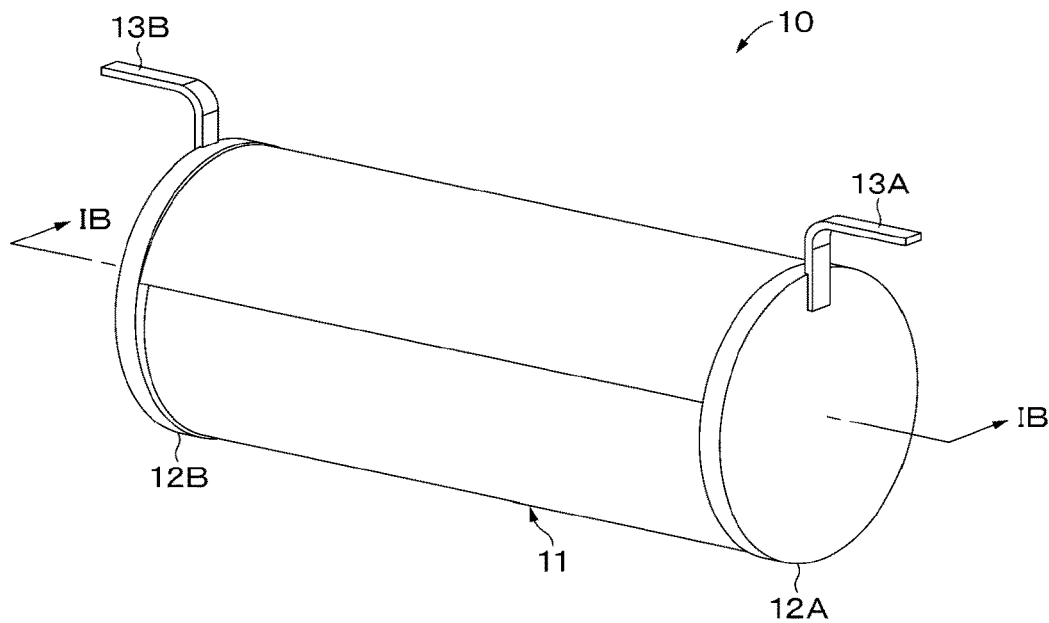
FIG. 1A is a perspective view illustrating an example of an appearance of an actuator according to a first embodiment of the present technology.
FIG. 1B is a cross-sectional view taken along line IB-IB of FIG. 1A.
Figure 1:
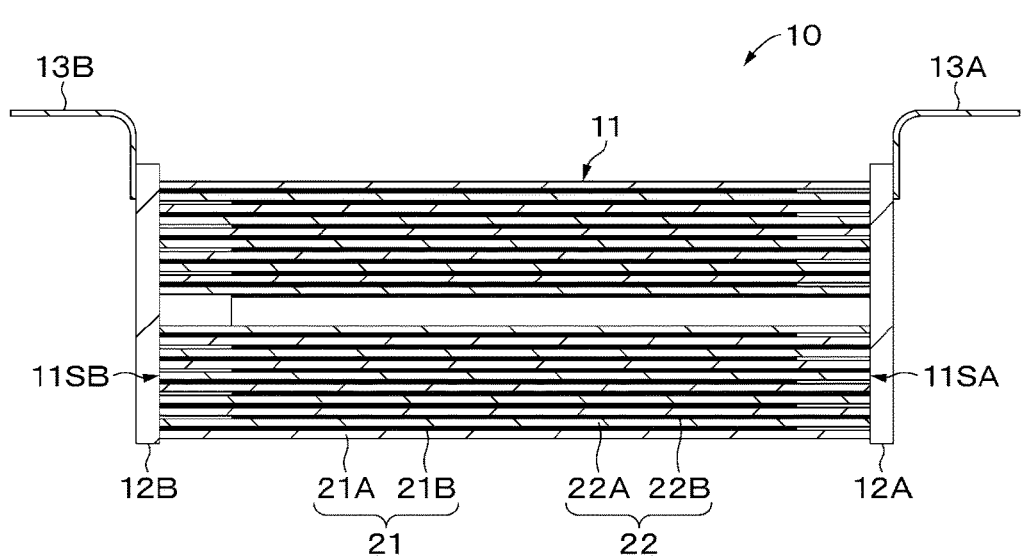

An actuator 10 according to a first embodiment of the present technology is a so-called dielectric elastomer actuator (DEA) and is provided with, as illustrated in FIGS. 1A and 1B, a substantially cylindrical wound body 11, a disk-shaped extracting electrode 12A provided so as to cover one end face 11SA of the wound body 11, and a disk-shaped extracting electrode 12B provided so as to cover the other end face 11SB of the wound body 11. Terminals 13A and 13B are provided on the extracting electrodes 12A and 12B, respectively, and the terminals 13A and 13B are electrically connected by wiring to a voltage source (not illustrated). The wound body 11 may have a bar shape or may have a fiber shape. Note that, FIGS. 1A and 1B illustrate an example in which the wound body 11 has a bar shape.

The actuator 10 according to the first embodiment is provided on, for example, medical instruments such as artificial muscles or endoscopes, industrial instruments, antennas, electronic devices, tactile sense presenting devices, vibrating devices such as vibrators, acoustic transducers (such as speakers), pumps, valves, drones, fitting devices, sensors, rehabilitation instruments, robots, robot suits, micro devices, anti-shake modules or the like. Examples of the electronic devices include, but are not limited to, for example, personal computers, mobile devices, mobile phones, tablet computers, display devices, imaging devices, audio devices, game devices and the like.

Wound Body

Figure 2:
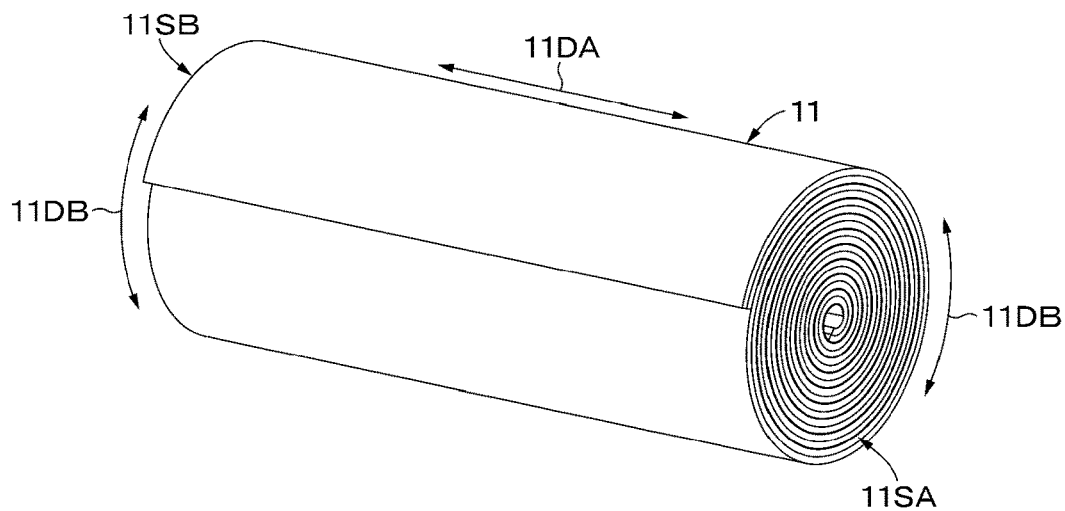
FIG. 2A is a perspective view illustrating an example of an appearance of a wound body.
FIG. 2B is an exploded perspective view illustrating an example of the wound body in a fully unwound state.
FIG. 2C is an exploded perspective view illustrating an example of the wound body in a partially unwound state.
Figure 2:
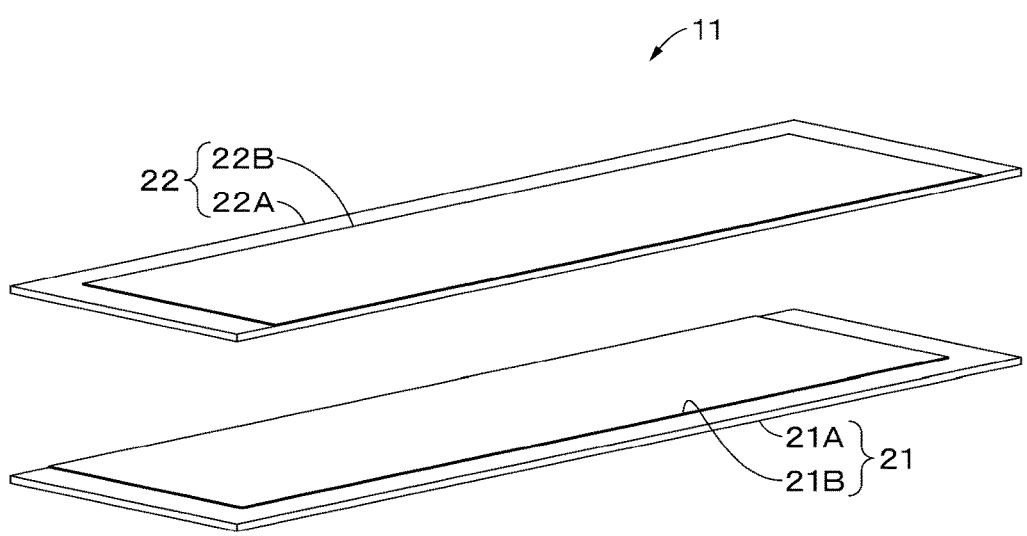
Figure 2:
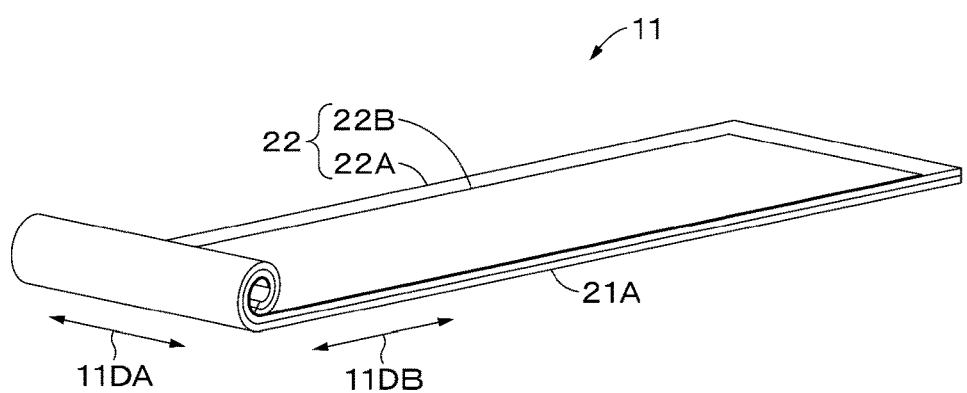

FIG. 2A illustrates an example of an appearance of the wound body 11. FIG. 2B illustrates an example of the wound body in a fully unwound state. FIG. 2C illustrates an example of the wound body in a partially unwound state. The wound body 11 is a main body of the actuator 10 and is provided with an electrode sheet 21 having an elongated shape and an electrode sheet 22 having an elongated shape.

The electrode sheet 21 is an example of a first laminate and is provided with an elastomer layer (dielectric layer) 21A having elasticity and an electrode 21B having elasticity provided on one surface of the elastomer layer 21A. The elastomer layer 21A and the electrode 21B both have elongated rectangular shapes, and the elastomer layer 21A is slightly larger than the electrode 21B. The electrode 21B is provided on the one surface of the elastomer layer 21A so that longitudinal directions of the elastomer layer 21A and the electrode 21B coincide with each other.

The electrode sheet 22 is an example of a second laminate and is provided with an elastomer layer (dielectric layer) 22A having elasticity and an electrode 22B having elasticity provided on one surface of the elastomer layer 22A. The elastomer layer 22A and the electrode 22B both have elongated rectangular shapes, and the elastomer layer 22A is slightly larger than the electrode 22B. The electrode 22B is provided on the one surface of the elastomer layer 22A so that longitudinal directions of the elastomer layer 22A and the electrode 21B coincide with each other.

The electrode sheets 21 and 22 are spirally wound in the longitudinal direction of the electrode sheets 21 and 22 in such a manner that respective sides are overlapped, and the elastomer layers 22A and 22A are alternately interposed between the wound electrodes 21B and 22B from the center toward an outer circumference of the wound body 11.

Specifically, the electrode sheets 21 and 22 are wound in the longitudinal direction of the electrode sheets 21 and 22 in such a manner that the electrode 22B, the elastomer layer 22A, the electrode 21B, and the elastomer layer 21A are repeated in this order from the center toward the outer circumference of the wound body 11.

One long side of the electrode 21B is located on an inner side of one long side of the elastomer layer 21A as illustrated in FIGS. 2B and 2C, whereas the other long side of the electrode 21B is overlapped with the other long side of the elastomer layer 21A. Furthermore, one long side of the electrode 22B is overlapped with one long side of the elastomer layer 22A as illustrated in FIGS. 2B and 2C, whereas the other long side of the electrode 22B is located on an inner side of the other long side of the elastomer layer 22A.

Figure 3:
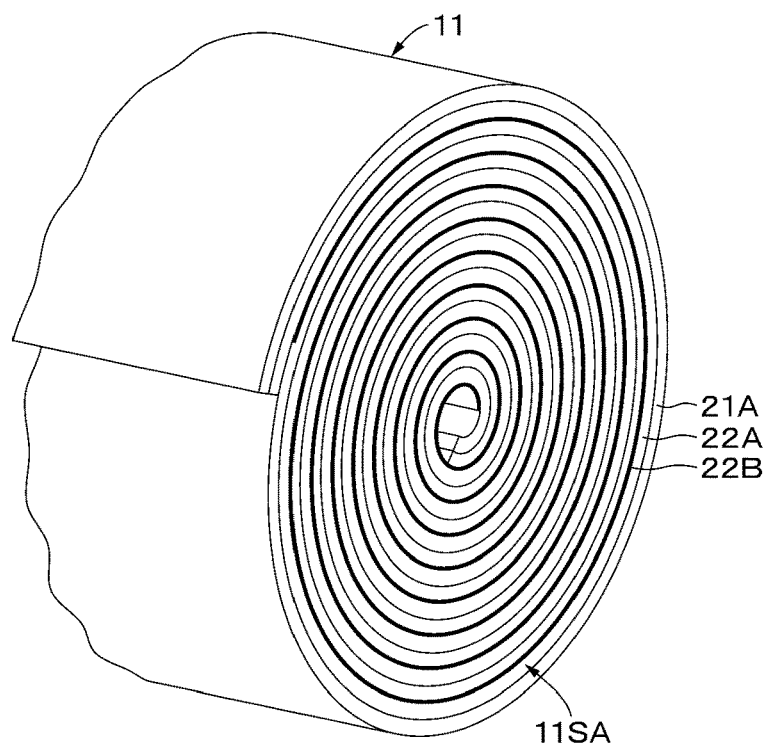
FIG. 3A is an enlarged perspective view of one end face of the wound body.
FIG. 3B is an enlarged perspective view of the other end face of the wound body.
Figure 3:
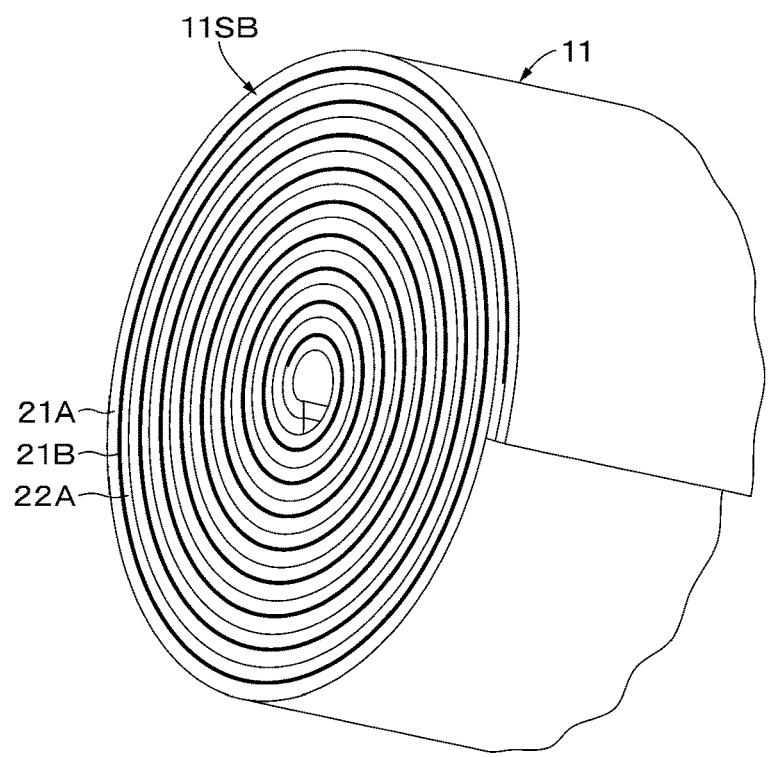

The electrode sheets 21 and 22 are overlapped with each other so that the one long side of the electrode 22B is on a side of one end face 11SA of the wound body 11 and the other long side of the electrode 21B is on a side of the other end face 11SB of the wound body 11. Therefore, as illustrated in FIG. 3A, the one long side of the electrode 22B is exposed from the one end face 11SA of the wound body 11, whereas the one long side of the electrode 21B is not exposed. Furthermore, as illustrated in FIG. 3B, the other long side of the electrode 21B is exposed from the other end face 11SB of the wound body 11, whereas the other long side of the electrode 22B is not exposed.

The long side of the electrode 22B exposed from the one end face 11SA is in contact with one main surface of the extracting electrode 12A. Furthermore, the long side of the electrode 21B exposed from the other end face 11SB is in contact with one main surface of the extracting electrode 12B.

Pre-distortion (that is, biaxial extension) is applied to the electrode sheets 21 and 22 (that is, the elastomer layers 21A and 22A and the electrodes 21B and 22B) in an axial direction 11DA and a circumferential direction 11DB of the wound body 11. Since the pre-distortion is applied to the electrode sheets 21 and 22 in this manner, the elastomer layers 21A and 22A may be thinned, so that a driving voltage of the actuator 10 may be reduced.

A stress ratio (A:B) between a stress A in the axial direction 11DA and a stress B in the circumferential direction 11DB of the electrode sheets 21 and 22 to which the pre-distortion is applied is preferably 1:2. By setting such a stress ratio, a contraction force in the axial direction 11DA and a contraction force in the circumferential direction 11DB of the electrode sheet 21 and 22 may be balanced. Therefore, a pre-distorted state (that is, an extended state) may be held without a support member.

Area distortion of the electrode sheets 21 and 22 to which the pre-distortion is applied is 10% or larger, preferably 30% or larger, more preferably 50% or larger, and still more preferably 70% or larger, and particularly preferably 100% or larger. When the area distortion of the electrode sheets 21 and 22 is 10% or larger, the actuator 10 may be thinned. Furthermore, since the elastomer layers 21A and 22A may be thinned, the driving voltage of the actuator 10 may be reduced.

In order to suppress breakage of the electrode sheets 21 and 22 and suppress an increase in resistance value, an upper limit value of the surface distortion of the electrode sheets 21 and 22 to which the pre-distortion is applied is preferably 10000% or smaller, more preferably 5000% or smaller, still more preferably 3000% or smaller, particularly preferably 1000% or smaller, and most preferably 500% or smaller.

The above-described area distortion of the electrode sheets 21 and 22 is a ratio of an area S of the electrode sheets 21 and 22 to which the pre-distortion is applied to an area S0 of the electrode sheets 21 and 22 in a state in which the pre-distortion is released $((S-S0)/S0)\times 100)[\%]$. Here, the areas S0 and S are values measured at room temperature (23° C.)

Elastomer Layer

The elastomer layers 21A and 22A are sheets having elasticity. An average thickness of the elastomer layers 21A and 22A in a pre-distorted state is preferably 10 μm or smaller, more preferably 5 μm or smaller, and still more preferably 3 μm or smaller from the viewpoint of reducing the driving voltage. In a case where the elastomer layers 21A and 22A are not pre-distorted (that is, not extended), it is difficult to make the average thickness of the elastomer layers 21A and 22A 10 μm or smaller. A lower limit value of the average thickness of the elastomer layers 21A and 22A in the pre-distorted state is not particularly limited, but is, for example, 300 nm or larger.

The average thickness of the elastomer layers 21A and 22A in the state in which the pre-distortion is released is preferably 40 μm or smaller, more preferably 20 μm or smaller, and still more preferably 12 μm or smaller from the viewpoint of reducing the driving voltage. A lower limit value of the average thickness of the elastomer layers 21A and 22A in the state in which the pre-distortion is released is not particularly limited, but is, for example, 1 μm or larger.

The average thickness of the elastomer layers 21A and 22A is obtained as follows. First, the wound body 11 is processed by a focused ion beam (FIB) method or the like to prepare a cross-section, and a cross-sectional image (hereinafter referred to as a "cross-sectional SEM image") is captured using a scanning electron microscope (SEM). Next, ten points are randomly selected from the elastomer layers 21A and 22A in the cross-sectional SEM image, the thickness of the elastomer layers 21A and 22A is measured at each point, and measured values are simply averaged (arithmetically averaged) to obtain the average thickness of the elastomer layers 21A and 22A.

A Young's modulus of the elastomer layers 21A and 22A is preferably 10 MPa or smaller, more preferably 0.05 MPa or larger and 10 MPa or smaller, and still more preferably 0.1 MPa or larger and 1 MPa or smaller. The above-described Young's modulus is a value measured in accordance with JIS K 6251:2010. Extension is easy when the Young's modulus is 10 MPa or smaller. On the other hand, handling is easily when the Young's modulus is 0.05 MPa or larger. Breaking distortion of the elastomer layers 21A and 22A is preferably 50% or larger, more preferably 100% or larger, still more preferably 150% or larger, and particularly preferably 200% or larger. When the breaking distortion is 50% or larger, an extension amount may be made larger. An upper limit value of the breaking distortion of the elastomer layers 21A and 22A is not particularly limited, but is, for example, 1200% or smaller. The breaking distortion of the elastomer layers 21A and 22A is the breaking distortion in the axial direction 11DA and the circumferential direction 11DB of the wound body 11, and is measured, for example, in accordance with JIS K 6251:2010.

The elastomer layers 21A and 22A include, for example, an insulating elastomer as an insulating elastic material. The elastomer layers 21A and 22A may also include an additive as needed. The additive is, for example, at least one of a crosslinking agent, a plasticizer, an antiaging agent, a surfactant agent, a viscosity modifier, a reinforcing agent, a coloring agent or the like. The insulating elastomer includes, for example, at least one of acrylic rubber, silicone rubber, ethylene-propylene-diene terpolymer (EPDM), natural rubber (NR), butyl rubber (IIR), isoprene rubber (IR), acrylonitrile-butadiene copolymer rubber (NBR), hydrogenated-acrylonitrile-butadiene copolymer rubber (H-NBR), hydrin rubber, chloroprene rubber (CR), fluororubber, urethane rubber or the like.

Electrode

The electrodes 21B and 22B have elasticity. Since the electrodes 21B and 22B have elasticity, when the actuator 10 is driven, the electrodes 21B and 22B may be deformed following deformation of the elastomer layers 21A and 22A. Furthermore, as described later, when the wound body 11 is extended, the electrodes 21B and 22B may be deformed so as to follow the deformation of the elastomer layers 21A and 22A.

The electrodes 21B and 22B have, for example, a solid state, a gel state, or a liquid state. The electrodes 21B and 22B may be thin films, or may be conductive materials supported on the surfaces of the elastomer layers 21A and 22A in a binderless manner.

An average thickness of the electrodes 21B and 22B in the state in which the pre-distortion is released is preferably 50 μm or smaller, more preferably 5 μm or smaller, and still more preferably 3 μm or smaller. A lower limit value of the average thickness of the electrodes 21B and 22B in the state in which the pre-distortion is released is not particularly limited, but is, for example, 300 nm or larger. The above-described average thickness of the electrodes 21B and 22B is obtained in a manner similar to that of the above-described average thickness of the elastomer layers 21A and 22A.

The Young's modulus of the electrodes 21B and 22B is preferably 10 MPa or smaller, more preferably 0.05 MPa or larger and 10 MPa or smaller, and still more preferably 0.1 MPa or larger and 1 MPa or smaller. The above-described Young's modulus is a value measured in accordance with JIS K 6251:2010. Extension is easy when the Young's modulus is 10 MPa or smaller. On the other hand, handling is easily when the Young's modulus is 0.05 MPa or larger. Breaking distortion of the electrodes 21B and 22B is preferably 50% or larger, more preferably 100% or larger, still more preferably 150% or larger, and particularly preferably 200% or larger. When the breaking distortion is 50% or larger, the extension amount may be increased. An upper limit value of the breaking distortion of the electrodes 21B and 22B is not particularly limited, but is, for example, 1200% or smaller. The breaking distortion of the electrodes 21B and 22B is the breaking distortion in the axial direction 11DA and the circumferential direction 11DB of the wound body 11, and is measured, for example, in accordance with JIS K 6251:2010.

Volume resistivity of the electrodes 21B and 22B in a state in which the distortion of 100% or larger is applied to the wound body 11 is preferably 10 MΩ·cm or smaller. As a result, also in a case where the distortion of 100% or larger is applied to the wound body 11, the electrodes 21B and 22B are allowed to serve as electrodes having excellent conductivity. An upper limit value of the above-described distortion is not particularly limited, but is preferably 1000% or smaller, more preferably 500% or smaller. The above-described volume resistivity of the electrodes 21B and 22B is a value obtained by a four-terminal method in accordance with JIS K 7194-1994. Adhesiveness between the electrodes 21B and 22B and the elastomer layers 21A and 22A, respectively, is preferably any one of classes 0 to 2 in a cross cut test in accordance with JIS K 5600-5-6:1999. In any one of the classes 0 to 2, it is possible to suppress peeling of the elastomer layers 21A and 22A from the electrodes 21B and 22B, respectively, due to a difference in rigidity between the elastomer layers 21A and 22A and the electrodes 21B and 22B when the wound body 11 is greatly extended such that the pre-distortion of 50% or larger is applied.

The electrodes 21B and 22B include a conductive material. The electrodes 21B and 22B may further include at least one of binder, gel, suspension, or oil having elasticity as needed. Furthermore, the electrodes 21B and 22B may further include an additive as needed.

The conductive material is, for example, at least one of a conductive filler or a conductive polymer. A shape of the conductive filler may be, for example, a spherical shape, an ellipsoidal shape, a needle shape, a plate shape, a scale shape, a tubular shape, a wire shape, a bar shape (rod shape), a fiber shape, an irregularly shape and the like, but the shape is not particularly limited thereto. Note that, it is possible to use only the conductive filler of one shape, or combine the conductive fillers of two or more types of shapes to use.

The conductive filler includes, for example, at least one of a carbon-based filler, a metal-based filler, a metal oxide-based filler, or a metal-coated filler. Here, it is defined that metal includes semi metal.

The carbon-based filler includes, for example, at least one of carbon black (for example, Ketjen black, acetylene black and the like), porous carbon, carbon fiber (for example, PAN-based one, pitch-based one and the like), carbon nano-fiber, fullerene, graphene, vapor grown carbon fiber (VGCF), carbon nanotube (for example, SWCNT, MWCNT and the like), carbon microcoil, or carbon nanohorn.

The metal-based filler includes, for example, at least one of copper, silver, gold, platinum, palladium, nickel, tin, cobalt, rhodium, iridium, steel, ruthenium, osmium, manganese, molybdenum, tungsten, niobium, tantalum, titanium, bismuth, antimony, or lead.

The metal oxide-based filler includes an indium tin oxide (ITO), a zinc oxide, an indium oxide, an antimony-added tin oxide, a fluorine-added tin oxide, an aluminum-added zinc oxide, a gallium-added zinc oxide, a silicon-added zinc oxide, zinc oxide-tin oxide, indium oxide-tin oxide, zinc oxide-indium oxide-magnesium oxide or the like, for example.

The metal-coated filler is obtained by coating a base filler with metal. The base filler is, for example, mica, glass bead, glass fiber, carbon fibers, calcium carbonate, zinc oxide or titanium oxide. The metal coating the base filler includes, for example, at least one of Ni or Al.

The conductive polymer is, for example, at least one of polyethylene dioxythiophene/polystyrene sulfonic acid (PEDOT/PSS), polyaniline, polyacetylene, or polypyrrole.

The binder is preferably an elastomer. As the elastomer, one similar to that of the elastomer layers 21A and 22A may be exemplified. As the additive, one similar to that of the elastomer layers 21A and 22A may be exemplified.

The electrodes 21B and 22B may include a composite material (complex material). The composite material includes, for example, at least one of a composite material of the elastomer and at least one of the conductive polymer or the conductive filler, a composite material including an elastic ion conductive material and an electrolyte, a composite material of polymer suspension (acrylic emulsion and the like) and at least one of the conductive polymer or the conductive filler, a composite material of a block copolymer and at least one of the conductive polymer or the conductive filler, or a composite material of polymer gel and an ionic conductor.

Improvement in Adhesiveness

Interfaces between the elastomer layers 21A and 22A and the electrodes 21B and 22B, respectively, are preferably treated to improve the adhesiveness. By improving the adhesiveness, it is possible to suppress peeling of the elastomer layers 21A and 22A from the electrodes 21B and 22B, respectively, due to the difference in rigidity between the elastomer layers 21A and 22A and the electrodes 21B and 22B when the wound body 11 is greatly extended such that the pre-distortion of 50% or larger is applied.

In order to improve the adhesiveness of the interface, the wound body 11 is preferably provided with at least one of (1) a silane coupling agent provided between the elastomer layers 21A and 22A and the electrodes 21B and 22B, respectively, (2) a primer layer provided between the elastomer layers 21A and 22A and the electrodes 21B and 22B, respectively, (3) a surface of at least one of the elastomer layers 21A and 22A or the electrodes 21B and 22B physically pre-treated, or (4) a fine unevenness provided on a surface of at least one of the elastomer layers 21A and 22A or the electrodes 21B and 22B. Note that the physical pretreatment is, for example, at least one of excimer light irradiation treatment, ultraviolet light irradiation treatment, plasma treatment, or corona treatment.

Silane Coupling Agent

A type of the silane coupling agent is not particularly limited, and known silane coupling agents may be used. Specific examples of the silane coupling agent include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatopropyltriethoxysilane and the like.

Extracting Electrode

The extracting electrodes 12A and 12B are fixed to the end faces 11SA and 11SB, respectively. The extracting electrodes 12A and 12B preferably have elasticity. Since the extracting electrodes 12A and 12B may also expand and contract radially according to the expansion and contraction of the wound body 11 in the radial direction, it is possible to suppress the extracting electrodes 12A and 12B from peeling from the end faces 11SA and 11SB, respectively.

The extracting electrodes 12A and 12B include a conductive material. The extracting electrodes 12A and 12B may also include a binder having elasticity as needed. As the conductive material, one similar to that of the electrodes 21B and 22B may be exemplified. The binder is preferably an elastomer. As the elastomer, one similar to that of the elastomer layers 21A and 22A may be exemplified.

Operation of Actuator

Next, an example of operation of the actuator 10 according to the first embodiment of the present technology is described.

When a driving voltage is applied between the electrodes 21B and 22B facing each other with the elastomer layers 21A and 22A interposed therebetween, an attractive force due to the Coulomb force acts on the electrodes 21B and 22B. Therefore, the elastomer layers 21A and 22A arranged between the electrodes 21B and 22B are pressed in a thickness direction thereof to become thin and extend.

On the other hand, when the driving voltage applied between the electrodes 21B and 22B facing each other with the elastomer layers 21A and 22A interposed therebetween is released, the attractive force due to the Coulomb force no longer acts between the electrodes 21B and 22B. Therefore, the elastomer layers 21A and 22A are contracted by resilience of the elastomer layers 21A and 22A to return to their original size and thickness.

Method of Manufacturing Actuator

Next, an example of a method of manufacturing the actuator 10 according to the first embodiment of the present technology is described.

Step of Preparing Elastomer Layer Forming Paint

Elastomer layer forming paint is prepared by adding the elastomer to a solvent to disperse. At least one of resin materials or additives other than the elastomer may be further added to the solvent as needed. For example, in order to improve applicability of the elastomer layer forming paint to a base material (peeling base material) and pot life, the additive such as a surfactant agent, a viscosity modifier, and dispersant may be added as needed. As a dispersing method, it is preferable to use stirring, ultrasonic dispersion, bead dispersion, kneading, homogenizer treatment and the like.

The solvent is not particularly limited as long as this may disperse the elastomer. For example, water, ethanol, methyl ethyl ketone, isopropanol alcohol, acetone, anone (cyclohexanone, cyclopentanone), hydrocarbon (hexane), amide (DMF), sulfide (DMSO), butyl cellosolve, butyl triglycol, propylene glycol monomethyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, methyl glycol, terpineol, and butyl carbitol acetate may be used.

Step of Preparing Conductive Paint

A conductive paint which is an electrode forming paint is prepared by adding a conductive material to a solvent to disperse. At least one of binders or additives may be further added to the solvent as needed. For example, in order to improve applicability of the conductive paint to the elastomer layers 21A and 22A and pot life, additives such as a surfactant agent, a viscosity modifier, and dispersant may be added as needed. The conductive paint may be a conductive ink or a conductive paste. As a dispersing method, one similar to that at the preparing step of the elastomer layer forming paint may be exemplified. Furthermore, the solvent is not particularly limited as long as this may disperse the conductive material. For example, one similar to that at the preparing step of the elastomer layer forming paint may be exemplified.

Fabricating Step of Electrode Sheet

The electrode sheet 21 is fabricated as follows. First, a base material is prepared, one surface of the base material is subjected to a peeling treatment as needed. As the base material, an inorganic base material may be used, or a plastic base material may be used. Furthermore, as the base material, a plate-shaped one may be used and a sheet-shaped one may be used.

Next, the elastomer layer forming paint is applied to the one surface of the base material to form a coating film having an elongated rectangular shape. Here, application includes printing. As an applying method, for example, a microgravure coating method, a wire bar coating method, a direct gravure coating method, a die coating method, a dip method, a spray coating method, a reverse roll coating method, a curtain coating method, a comma coating method, a knife coating method, a spin coating method, an ink jet printing method, a relief printing method, an offset printing method, a gravure printing method, an intaglio printing method, a rubber plate printing method, a screen printing method and the like may be used, but this is not particularly limited thereto. Subsequently, the coating film formed on the one surface of the base material is dried. A drying condition is not particularly limited, and may be either natural drying or heat drying. As a result, the elastomer layer 21A is formed on the one surface of the base material. Thereafter, one surface of the elastomer layer 21A may be treated to improve the adhesiveness as described above as needed.

Next, the conductive paint is applied to the one surface of the elastomer layer 21A to form a coating film having an elongated rectangular shape. At that time, the coating film is formed such that one long side of the coating film is located on an inner side of one long side of the elastomer layer 21A, whereas the other long side of the coating film overlaps with the other long side of the elastomer layer 21A. As an applying method, a method similar to that when applying the elastomer layer forming paint may be exemplified.

Subsequently, the coating film formed on the one surface of the elastomer layer 21A is dried to form the electrode 21B. A drying condition is not particularly limited, and may be either natural drying or heat drying. The electrode sheet 21 is fabricated as described above.

The electrode sheet 22 is fabricated in a manner similar to that of the electrode sheet 21.

Step of Laminating Electrode Sheet

As illustrated in FIG. 2B, a laminate having an elongated rectangular shape is obtained by placing the electrode sheet 22 on the electrode sheet 21 so as to overlap the respective sides of the elastomer layers 21A and 22A and interpose the elastomer layer 22A between the electrodes 21B and 22B. At that time, a laminating direction of the electrode sheets 21 and 22 is adjusted so that the one long side of the electrode 22B is exposed from the end face on a side of one long side of the laminate, and the other long side of the electrode 21B is exposed from the end face on a side of the other long side of the laminate.

Rolling Step of Laminate

As illustrated in FIG. 2C, by winding the obtained laminate in a longitudinal direction while biaxially extending the laminate in a width direction (axial direction) 11DA and a longitudinal direction (circumferential direction) 11DB of the laminate, so that the wound body 11 illustrated to FIG. 2A is obtained.

Fixing Step of Extracting Electrode

Subsequently, the extracting electrode 12A is fixed to the one end face 11SA of the wound body 11 by adhesion or welding, and the extracting electrode 12B is fixed to the other end face 11SB by adhesion or welding. In this manner, the actuator 10 illustrated in FIG. 1A is obtained.

Effect

The actuator 10 according to the first embodiment is provided with the electrode sheet 21 as the first laminate and the electrode sheet 22 as the second laminate, the electrode sheets 21 and 22 have a spiral or concentric shape, the pre-distortion is applied to the electrode sheets 21 and 22, and the area distortion of the electrode sheets 21 and 22 is 10% or larger. As a result, the actuator 10 may be thinned. Furthermore, since the elastomer layers 21A and 22A may be thinned, the driving voltage of the actuator 10 may be reduced.

In a case where the stress ratio (A:B) between the stress A in the axial direction 11DA and the stress B in the circumferential direction 11DB of the electrode sheets 21 and 22 to which the pre-distortion is applied is 1:2, it is possible to hold the wound body 11 in the pre-distorted state (that is, the extended state) without the support member. Therefore, a structure of an entire actuator 10 may be simplified. Furthermore, since a part of force generated by the actuator 10 is not consumed due to an influence of rigidity of the support member, a force which may be extracted to the outside may be increased.

Variation

Variation 1

At least one of the electrode 21B or the elastomer layer 22A adjacent in the wound body 11 may have stickiness. In this case, it is possible to suppress one end on an outer circumferential side of the electrode sheet 21 from peeling due to a tension force caused by extension. At least one of the electrode 22B or the elastomer layer 21A adjacent in the wound body 11 may have a sticky surface. In this case, it is possible to suppress one end on an outer circumferential side of the electrode sheet 22 from peeling due to a tension force caused by extension.

Furthermore, an end on the outer circumferential side of at least one of the electrode 21B or the elastomer layer 22A adjacent in the wound body 11 may have stickiness. An end on the outer circumferential side of at least one of the electrode 22B or the elastomer layer 21A adjacent in the wound body 11 may have stickiness.

Variation 2

Figure 4:
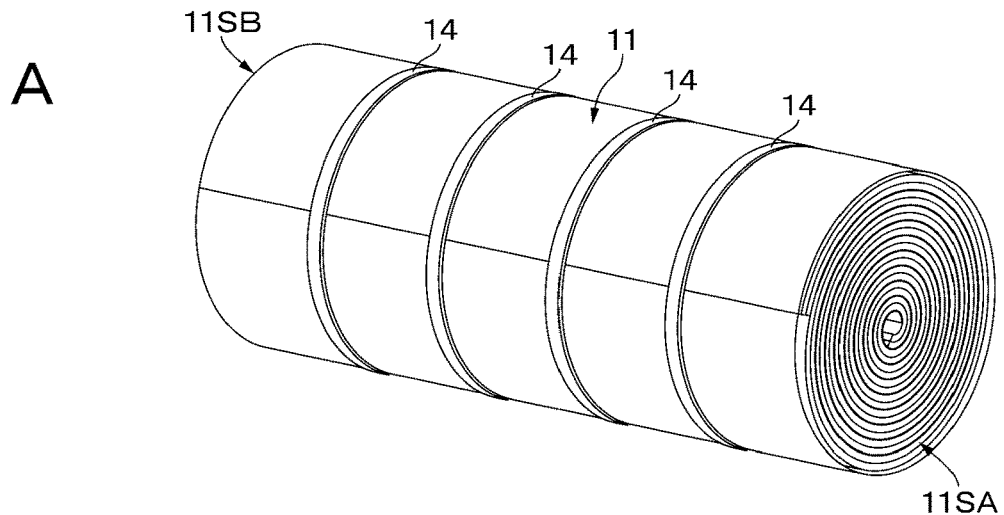
FIGS. 4A, 4B, and 4C are perspective views illustrating variations of the wound body.
Figure 4:
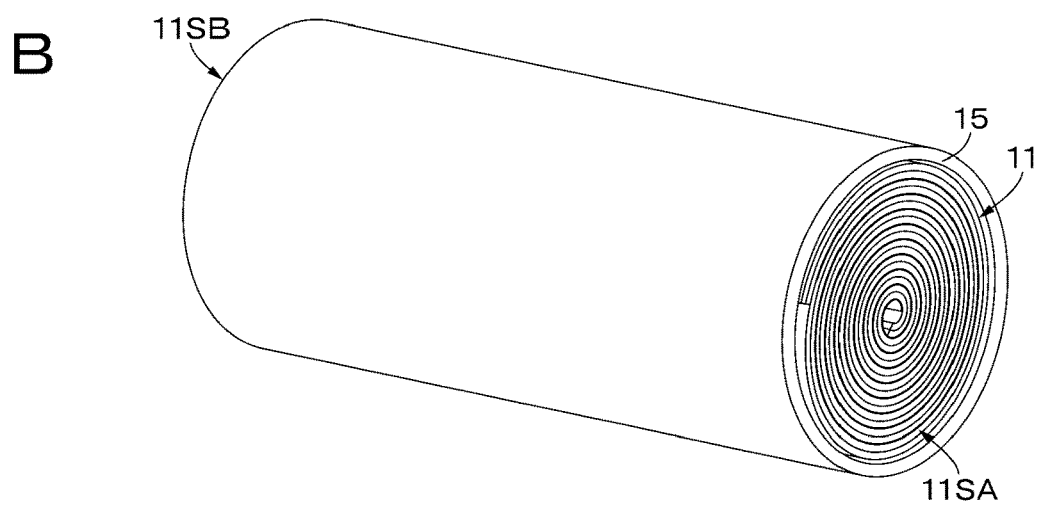
Figure 4:
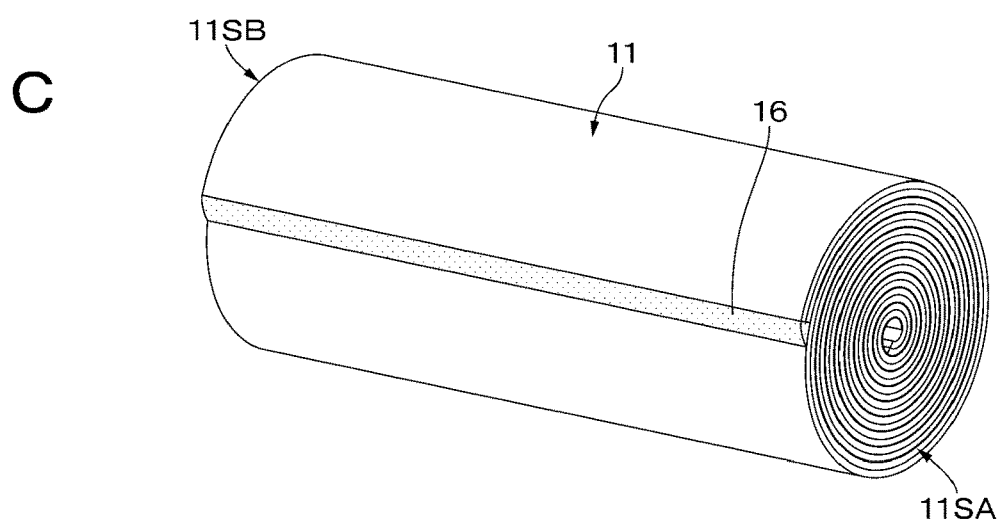
Figure 5:
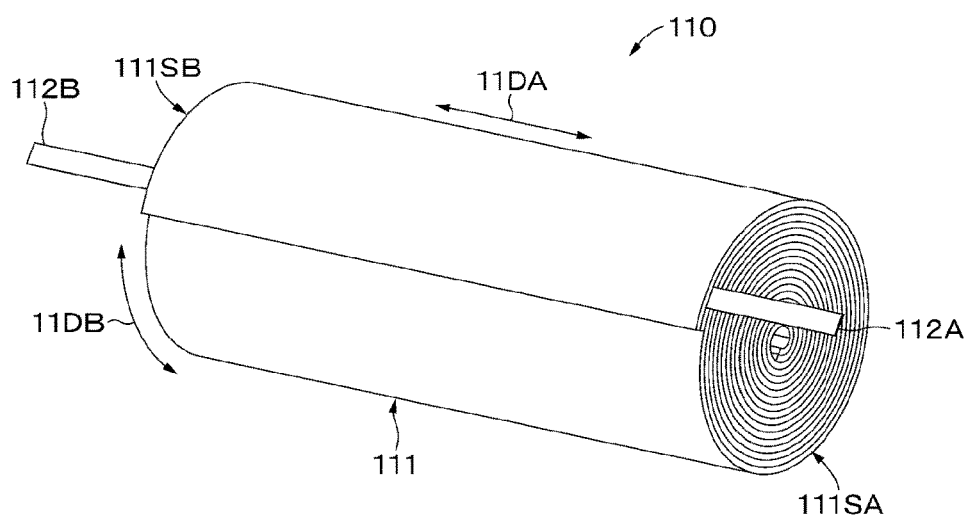
FIG. 5A is a perspective view illustrating an example of an appearance of an actuator according to a second embodiment of the present technology.
FIG. 5B is an enlarged plan view illustrating one end face of the actuator illustrated in FIG. 5A.
FIG. 5C is a cross-sectional view taken along line VC-VC of FIG. 5B.
Figure 5:
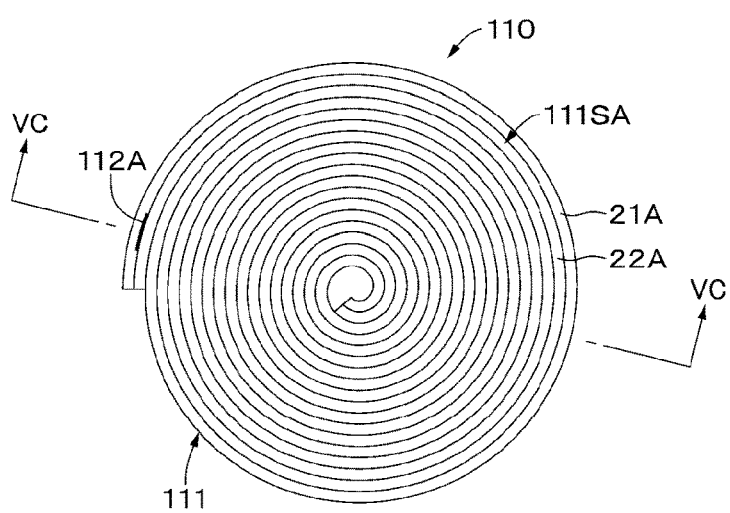
Figure 5:
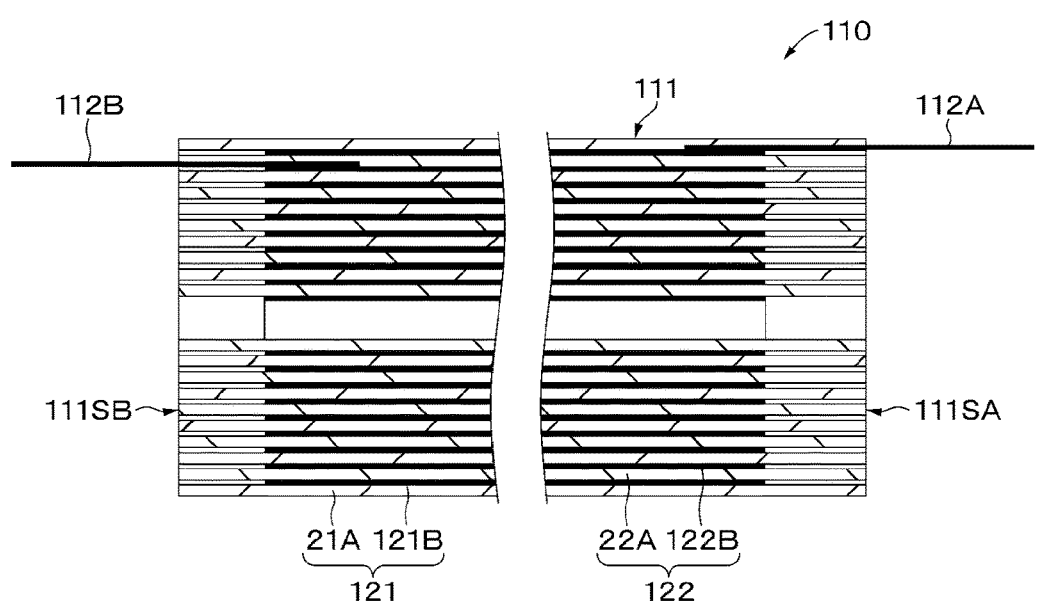

The actuator 10 may further be provided with one or two or more ring-shaped winding stop members 14 for stop winding the wound body 11 (that is, the wound electrode sheets 21 and 22) as illustrated in FIG. 4A. In this case, it is possible to suppress one ends on the outer circumferential side of the electrode sheets 21 and 22 from peeling due to a tension force caused by extension. It is preferable that the winding stop member 14 has elasticity. This is because, when the actuator 10 is driven, the winding stop member 14 may be deformed following the contraction of the wound body 11, so that positional deviation of the winding stop member 14 may be suppressed.

As the winding stop member 14, there may be, for example, a ring-shaped member having elasticity, a sticky tape having elasticity and the like. Note that, in a case of using the sticky tape as the winding stop member 14, the winding stop member 14 does not have to have a ring shape.

Variation 3

The actuator 10 may further be provided with a cylindrical housing member 15 for housing the wound body 11 as illustrated in FIG. 4B. In this case, it is possible to suppress one ends on the outer circumferential side of the electrode sheets 21 and 22 from peeling due to a tension force caused by extension. The housing member 15 preferably has elasticity. This is because, when the actuator 10 is driven, the housing member 15 may be deformed following the contraction of the wound body 11, so that the housing member 15 may be suppressed from being detached from the wound body 11.

Variation 4

As illustrated in FIG. 4C, one end on the outer circumferential side of the spirally wound electrode sheets 21 and 22, specifically one ends on the outer circumferential side of the elastomer layers 21A and 22A may be adhered to an outer peripheral surface of the wound body 11 by an adhesive 16 to stop winding. Note that, two or more of the configurations of the first to fourth variations may be combined.

Variation 5

A main body of the actuator 10 may be provided with a laminate including a plurality of concentric electrodes and a plurality of concentric elastomer layers in which the electrodes and the elastomers are alternately laminated in place of the wound body 11.

Variation 6

The wound body 11 may be formed by winding one laminate sheet provided with the elastomer layer 21A, the electrode 21B provided on one surface of the elastomer layer 21A, the elastomer layer 22A provided on one surface of the electrode 21B, and the electrode 22B provided on one surface of the elastomer layer 22A.

Variation 7

The electrodes 21B and 22B facing each other with the elastomer layers 21A and 22A interposed therebetween may be pattern electrodes having a predetermined pattern. For example, a plurality of electrodes 21B and 22B may face each other via the elastomer layers 21A and 22A and may be extended in the axial direction of the wound body 11. Furthermore, the plurality of electrodes 21B and 22B may be arranged at regular intervals in the circumferential direction of the elastomer layers 21A and 22A. As specific electrode patterns, a stripe pattern, a lattice pattern, a spiral pattern, a concentric pattern, a mesh pattern, a geometric pattern and the like may be exemplified, but there is no limitation.

Variation 8

At least one of the elastomer layers 21A and 22A or the electrodes 21B and 22B may be a member having a multi-layer structure. In this case, a surface layer of the member having the multilayer structure preferably has stickiness. This is because the adhesiveness between adjacent members may be improved.

Variation 9

In the first embodiment, the configuration in which the wound body 11 has a substantially cylindrical shape is described as an example, but the wound body 11 may also have a substantially prismatic shape. Furthermore, the wound body 11 may also have a tubular shape such as a substantially cylindrical shape or a substantially rectangular cylindrical shape. In this case, a support member such as a coil spring may be provided in a hollow internal space. Furthermore, the hollow internal space may be filled with liquid or solid in place of gas. Here, the liquid is, for example, water, saline solution or the like. Furthermore, the solid is, for example, a sol, a gel or the like.

Variation 10

In the first embodiment, the configuration in which the pre-distortion is applied to all of the electrode sheets 21 and 22, that is, the elastomer layer 21A, the electrode 21B, the elastomer layer 22A, and the electrode 22B is described; however, it is also possible that the pre-distortion is applied to at least one member out of the elastomer layer 21A and the electrode 21B, and the pre-distortion is applied to at least one member out of the elastomer layer 22A and the electrode 22B. Furthermore, it is possible that the pre-distortion is applied to at least one member out of the elastomer layer 21A, the electrode 21B, the elastomer layer 22A, and the electrode 22B. In a case of the above-described configuration, the area distortion of at least one member to which the pre-distortion is applied is 10% or larger, preferably 30% or larger, more preferably 50% or larger, still more preferably 70% or larger, and particularly preferably 100% or larger. Furthermore, the stress ratio (A:B) between the stress A in the axial direction 11DA and the stress B in the circumferential direction 11DB of the electrode sheets 21 and 22 to which the pre-distortion is applied may be made about 1:2.

2 Second Embodiment

Configuration of Actuator

Hereinafter, an example of a configuration of an actuator 110 according to a second embodiment of the present technology is described with reference to FIGS. 5A to 5C, 6A, and 6B. The actuator 110 is provided with a substantially cylindrical wound body 111, an extracting electrode 112A extracted from one end face 111SA of the wound body 111, and an extracting electrode 112B extracted from the other end face 111SB of the wound body. Note that, in the second embodiment, a portion similar to that in the first embodiment is assigned with the same reference sign and the description thereof is omitted.

The wound body 111 is a main body of the actuator 110, and is provided with an elongated electrode sheet 121 and an elongated electrode sheet 122.

Figure 6:
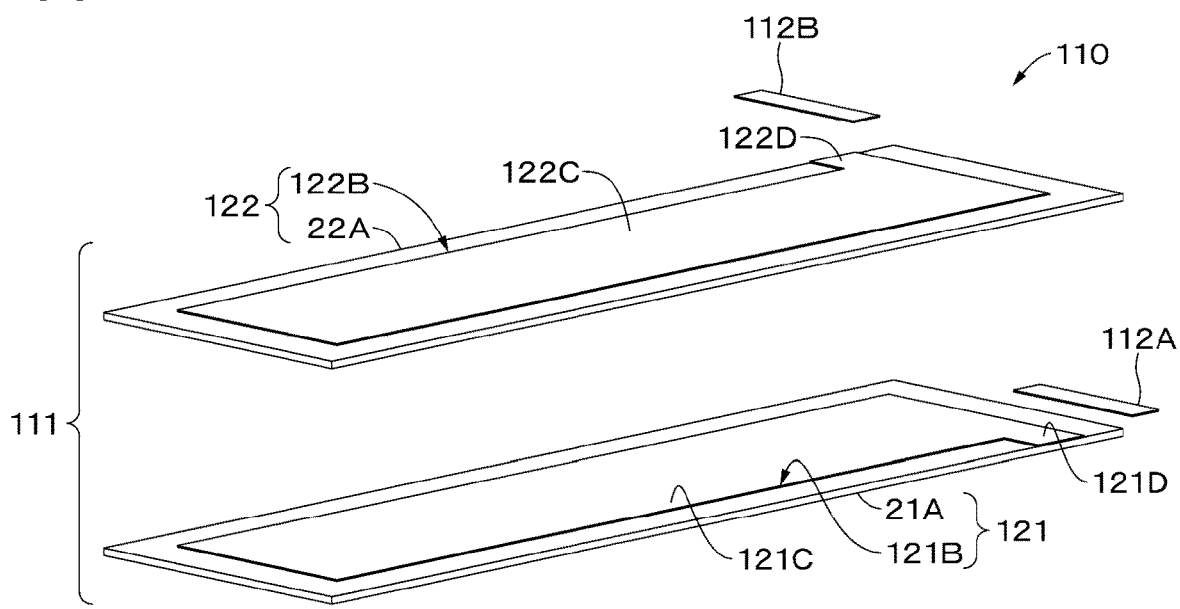
FIG. 6A is an exploded perspective view illustrating an example of the actuator in a fully unwound state.
FIG. 6B is an exploded perspective view illustrating an example of the actuator in a partially unwound state.
Figure 6:
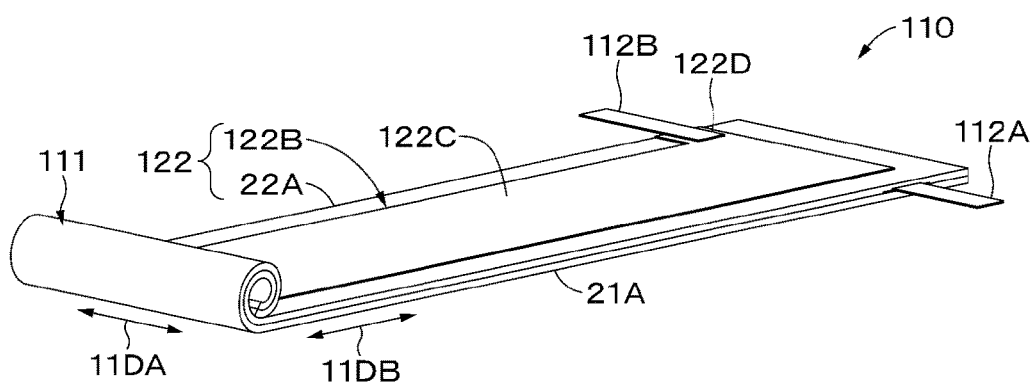

The electrode sheet 121 is provided with an elastomer layer (dielectric layer) 21A and an electrode 121B provided on one surface of the elastomer layer 21A and having elasticity. The electrode 21B includes a rectangular main body portion 121C and an extended portion 121D extended from a long side on a side of the one end face 111SA of both long sides of the main body portion 121C. The electrode 121B is provided on the one surface of the elastomer layer 21A so that longitudinal directions of the elastomer layer 21A and the main body portion 121C coincide with each other. The main body portion 121C is slightly smaller than the elastomer layer 21A, and a peripheral edge (that is, both end sides and both long sides) of the electrode 121B is located on an inner side of a peripheral edge (that is, both end sides and both long sides) of the elastomer layer 21A as illustrated in FIGS. 6A and 6B.

The electrode sheet 122 is provided with an elastomer layer (dielectric layer) 22A and an electrode 122B provided on one surface of the elastomer layer 22A and having elasticity. The electrode 122B includes a rectangular main body portion 122C and an extended portion 122D extended from a long side on a side of the other end face 111SB of both long sides of the main body portion 122C. The electrode 122B is provided on the one surface of the elastomer layer 22A so that longitudinal directions of the elastomer layer 22A and the main body portion 122C coincide with each other. The main body portion 122C is slightly smaller than the elastomer layer 21A, and a peripheral edge (that is, both end sides and both long sides) of the electrode 122B is located on an inner side of a peripheral edge (that is, both end sides and both long sides) of the elastomer layer 22A as illustrated in FIGS. 6A and 6B.

The extracting electrodes 112A and 112B are connected to the extended portions 121D and 122D, respectively, by welding or the like. The extended portions 121D and 122D are provided on one end on an outer circumferential side of the electrode sheets 121 and 122 out of the long sides of the main body portions 121C and 122C. Note that, positions of the extended portions 121D and 122D are not limited to them, and may be in portions corresponding to an intermediate periphery of the electrode sheets 121 and 122. However, in a case where the extended portions 121D and 122D are provided in the portions corresponding to the intermediate periphery of the electrode sheets 121 and 122, the electrode sheets 121 and 122 wound on the extracting electrodes 112A and 112B might be distorted. Such distortion tends to be promoted as the number of windings on the extracting electrodes 112A, 112B increases. Therefore, in order to make the shape of the wound body 111 closer to the cylindrical shape and obtain a higher performance actuator 110, as described above, the extended portions 121D and 122D are preferably provided on one end on the outer circumferential side of the long sides of the electrodes 121A and 121B.

Effect

In the actuator 110 according to the second embodiment, both the long sides of the main body portions 121C and 122C of the electrodes 121B and 122B are located on the inner side of both the long sides of the elastomer layers 21A and 22A, so that it is possible to suppress both the long sides of the electrodes 121A and 122B from exposing from the end faces 111SA and 111SB. Therefore, since it is possible to suppress the electrodes 121A and 122B from short-circuiting at the end faces 111SA and 111SB, safety of the actuator 110 may be improved.

Variation

Variation 1

Figure 7:
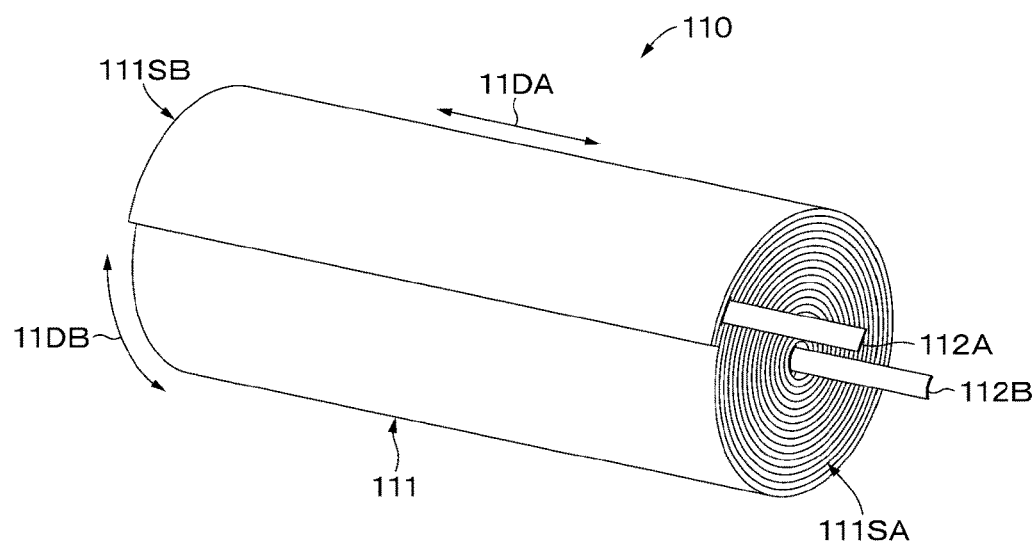
FIG. 7A is a perspective view illustrating a variation of the actuator.
FIG. 7B is an exploded perspective view illustrating an example of the actuator in a fully unwound state.
Figure 7:
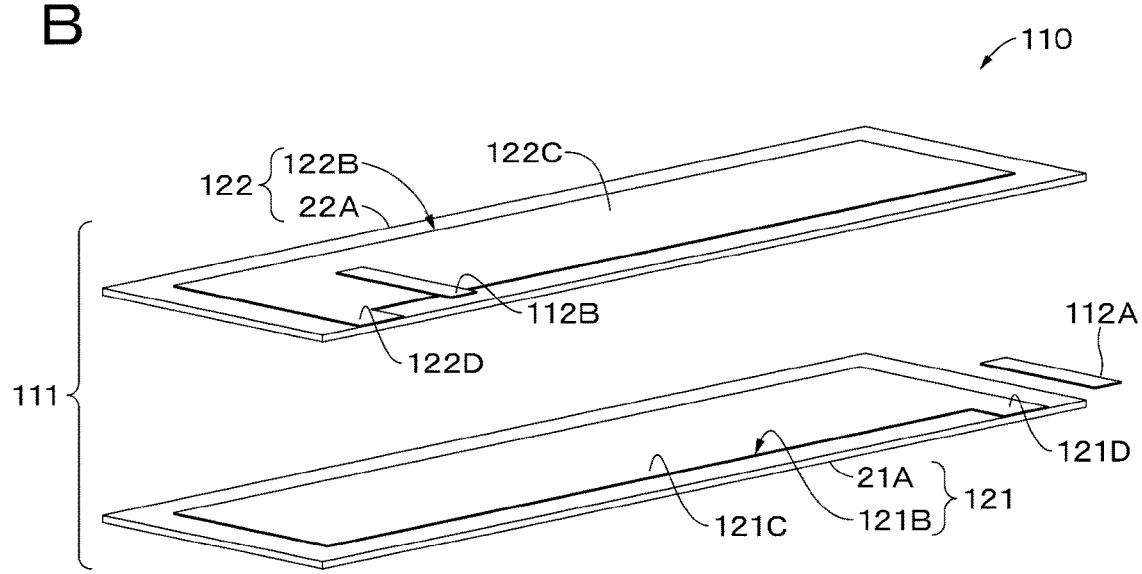

As illustrated in FIG. 7A, both the extracting electrodes 112A and 112B may be extracted from the one end face 111SA of the wound body 111. In this case, as illustrated in FIG. 7B, the extended portions 121D and 122D are extended from the long side on a side of the one end face 111SA of both the long sides of the main body portions 121C and 122C. Furthermore, the extended portion 121D is preferably provided on a position on one end of the long side on the side of the one end face 111SA, and the extended portion 122D is preferably provided on a position on the other end of the long side on the side of the one end face 111SA. This is because the shape of the wound body 111 may be made more cylindrical, and a higher performance actuator 110 may be obtained.

Variation 2

Figure 8:
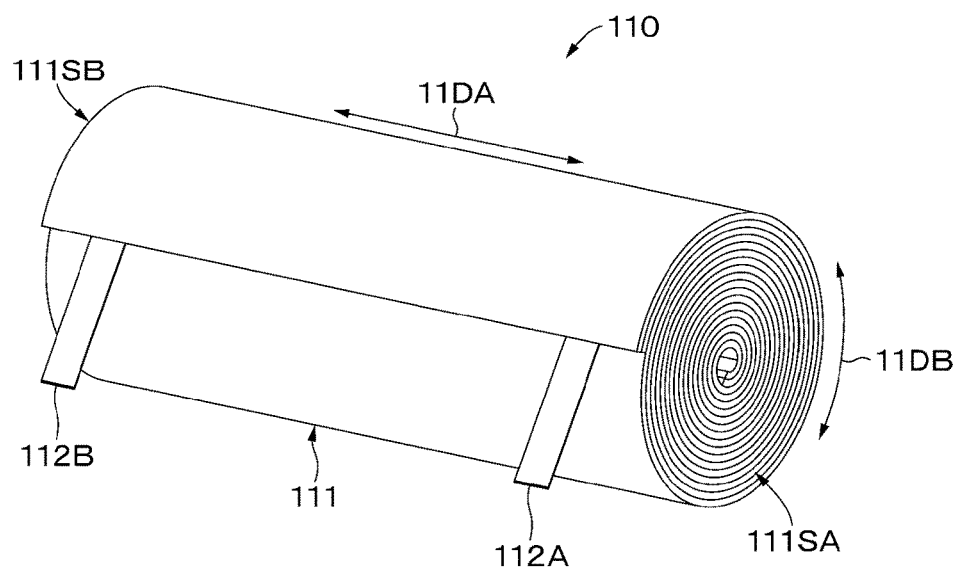
FIG. 8A is a perspective view illustrating a variation of the actuator.
FIG. 8B is an exploded perspective view illustrating an example of the actuator in a fully unwound state.
Figure 8:
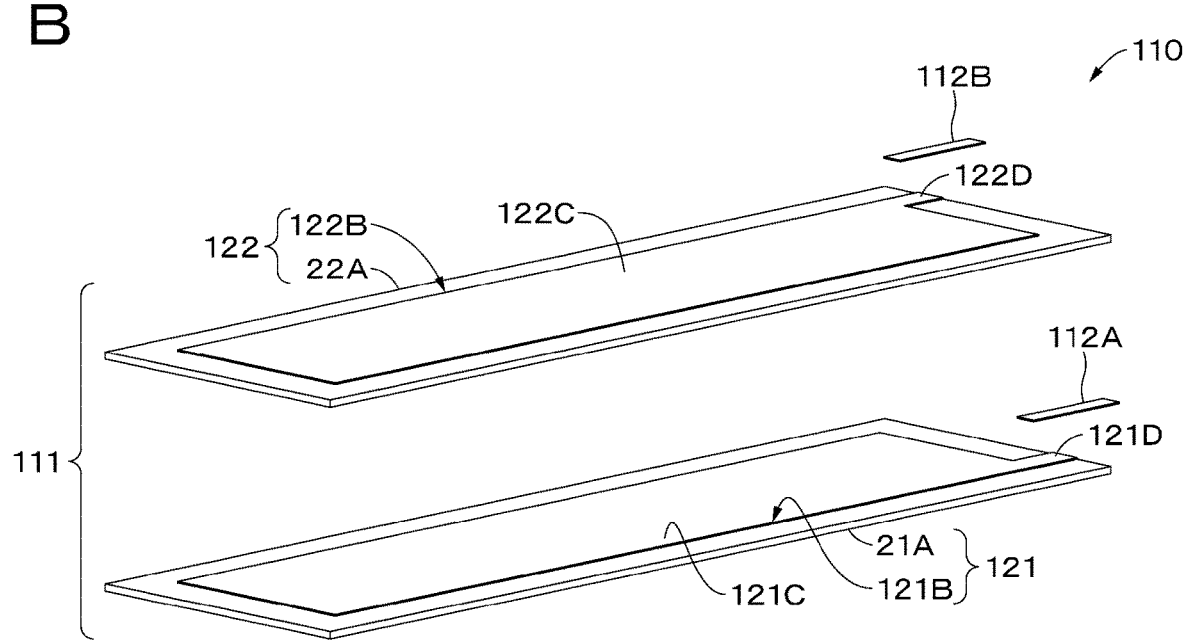

As illustrated in FIG. 8A, the extracting electrodes 112A and 112B may be extracted from an end on an outermost circumferential side of the wound body 111. By extracting the extracting electrodes 112A and 112B from such a position, the shape of the wound body 111 may be made more closer to a cylindrical shape, and the actuator 110 with higher performance may be obtained.

In a case of the above-described configuration, the extended portions 121D and 122D are extended from a short side on the outer circumferential side out of both the short sides of the main body portions 121C and 122C, as illustrated in FIG. 8B. Furthermore, it is preferable that the extended portion 121D is provided on a position on one end of the short side on the outer circumferential side, and the extended portion 121D is provided on the other end of the short side on the outermost circumferential side. This is because contact between the extracting electrodes 112A and 112B and short circuit may be suppressed.

3 Third Embodiment

Configuration of Actuator

Figure 9:
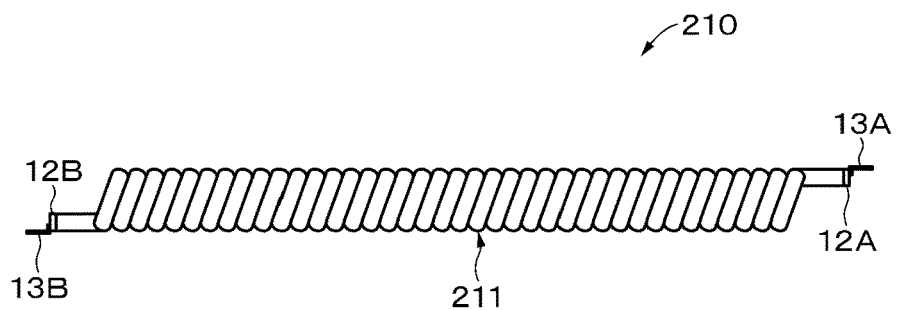
FIG. 9 is a plan view illustrating an example of a configuration of an actuator according to a third embodiment of the present technology.

An actuator 210 according to a third embodiment of the present technology is different from the actuator 10 according to the first embodiment in including a spirally twisted fiber-shaped wound body 211 as illustrated in FIG. 9. Note that, in the third embodiment, a portion similar to that in the first embodiment is assigned with the same reference sign and the description thereof is omitted.

Figure 10:
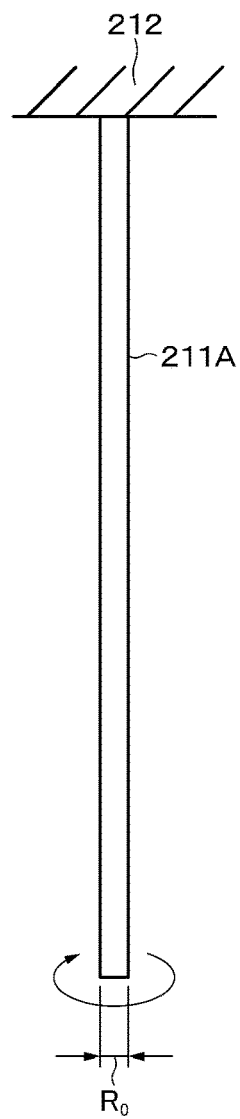
FIGS. 10A and 10B are flowcharts for illustrating an example of a method of manufacturing the actuator according to the third embodiment of the present technology.
Figure 10:
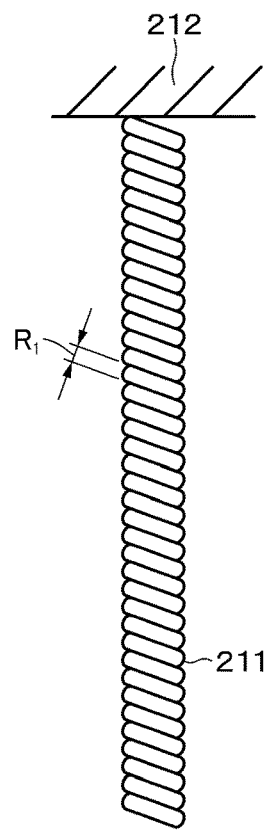

A tension force is applied in a central axis direction of the wound body 211 to the spirally twisted fiber-shaped wound body 211, and as illustrated in FIGS. 10A and 10B, the spirally twisted wound body 211 is longer than a wound body 211A in a state in which spiral twist is released. In other words, a diameter $R_1$ of the spirally twisted wound body 211 is smaller than a diameter $R_0$ of the wound body 211A in the state in which the spiral twist is released. The wound body 211 is similar to the wound body 11 of the first embodiment except the above-described points.

Method of Manufacturing Actuator

Next, an example of a method of manufacturing the actuator 210 according to the third embodiment of the present technology is described. First, the fiber-shaped wound body 211A is fabricated as in a manner similar to that in the first embodiment. Next, as illustrated in FIG. 10A, after fixing one end of the wound body 211A to a fixing member 212, the wound body 211A is twisted. At that time, the wound body 211A may be twisted while being pulled in a longitudinal direction thereof. As described above, the spirally twisted wound body 211 is obtained as illustrated in FIG. 10B.

Effect

The actuator 210 according to the third embodiment is provided with the spirally twisted fiber-shaped wound body 211. The diameter $R_1$ of the spirally twisted wound body 211 is smaller than the diameter $R_0$ of the wound body 211A in the state in which the spiral twist is released. Therefore, since the elastomer layers 21A and 22A are further thinned, a driving voltage of the actuator 10 may be further reduced.

Variation

Figure 11:
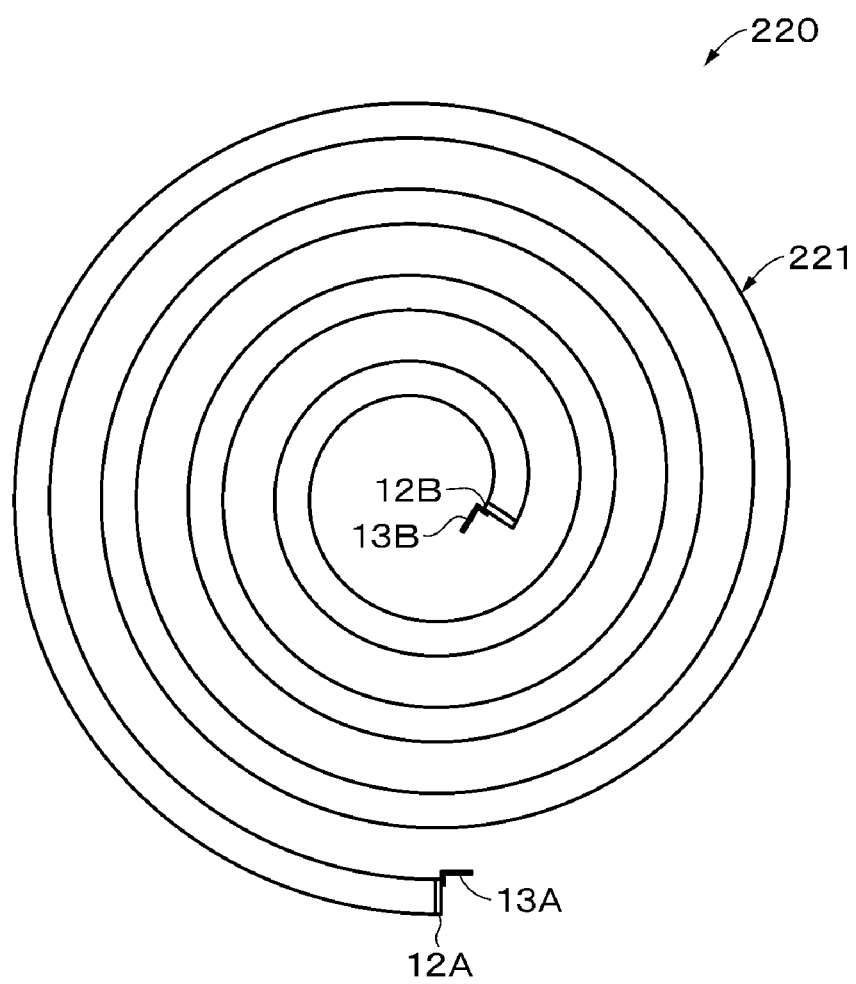
FIG. 11 is a plan view illustrating a variation of the actuator.

An actuator 220 may be provided with a spirally wound fiber-shaped wound body 221 as illustrated in FIG. 11. The actuator 220 having such a configuration may be used, for example, in a tactile sense presenting device and the like.

The wound body 211 may also be obtained by spirally twisting any of the wound body 11 and the laminate in the variation of the first embodiment (variation 5), and the wound body 111 in the second embodiment and the variation thereof. Furthermore, a plurality of bundled wound bodies 11 or laminates (variation 5 of the first embodiment) may be twisted.

4 Application Example

Configuration of Tactile Sense Presenting Device

Figure 12:
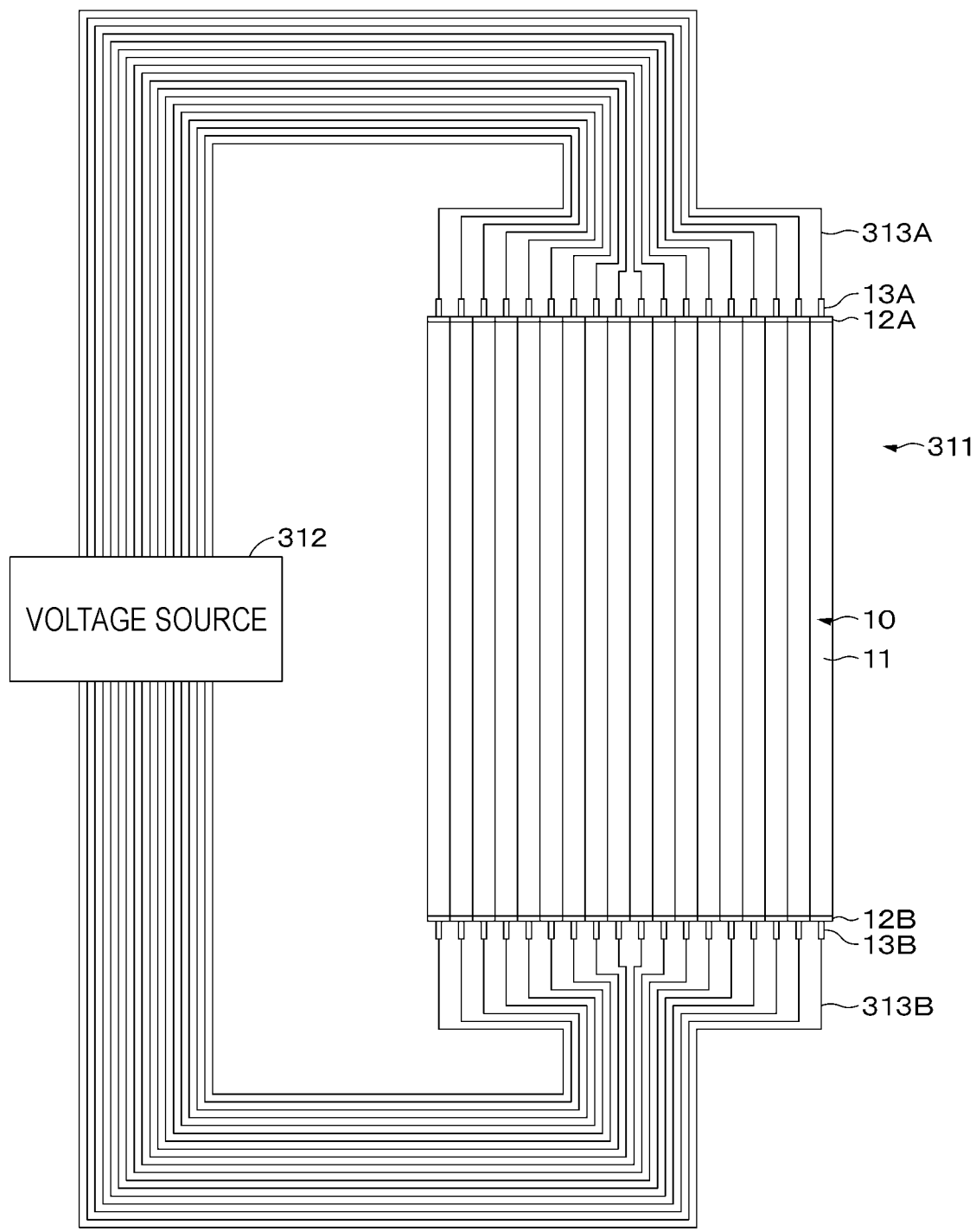
FIG. 12 is a schematic diagram illustrating an example of a configuration of a tactile sense presenting device as an application example.

An example in which the present technology is applied to a tactile sense presenting device is described with reference to FIG. 12. The tactile sense presenting device is an example of a driving device, and is provided with an actuator array 311, a voltage source 312, and a control unit not illustrated. Note that, in this application example, a portion similar to that in the first embodiment is assigned with the same reference sign and the description thereof is omitted.

The actuator array 311 is an example of a driving member, and is provided with a plurality of actuators 10 having a fiber shape. The plurality of actuators 10 is arranged in line such that axial directions of the respective actuators 10 are in the same direction, and peripheral surfaces of adjacent actuators 10 face each other. Terminals 13A and 13B are connected to the voltage source 312 via wiring 313A and wiring 313B, respectively. The voltage source 312 supplies a driving voltage of a predetermined frequency to each actuator 310 on the basis of a control signal from the control unit not illustrated.

Operation of Tactile Sense Presenting Device

An example of operation of the tactile sense presenting device having the above-described configuration is described with reference to FIGS. 13A and 13B. Here, as illustrated in FIG. 13A, a case in which both ends of the actuator array 311 forming the actuator array 311 are supported by support bodies 314 is described.

Figure 13:
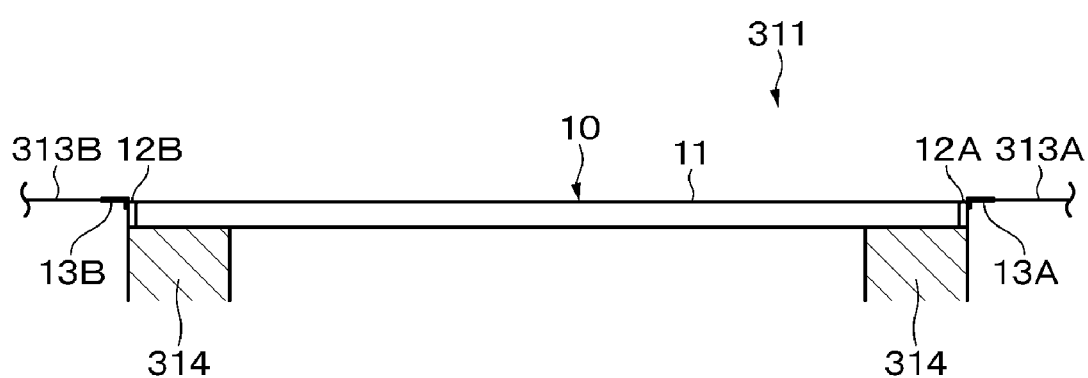
FIGS. 13A and 13B are side views for illustrating an example of operation of the tactile sense presenting device.
Figure 13:
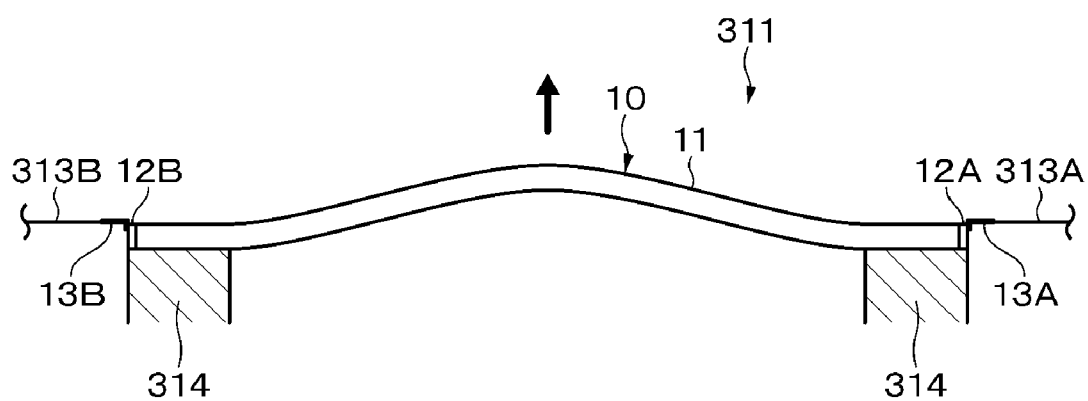

When a driving voltage is applied to the actuator 10, as illustrated in FIG. 13B, the actuator 10 extends and bends. When the driving voltage applied to the actuator 10 is released, as illustrated in FIG. 13A, the actuator 10 contracts to return to its original length, and becomes linear.

Variation

The actuator array 311 may be provided with any one of the actuator 10 according to the variation of the first embodiment, the actuator 110 according to the second embodiment and the variation thereof, and the actuator 210 according to the third embodiment and the variation thereof in place of the actuator 10 according to the first embodiment.

5 Application Example

Configuration of Tactile Sense Presenting Device

Figure 14:
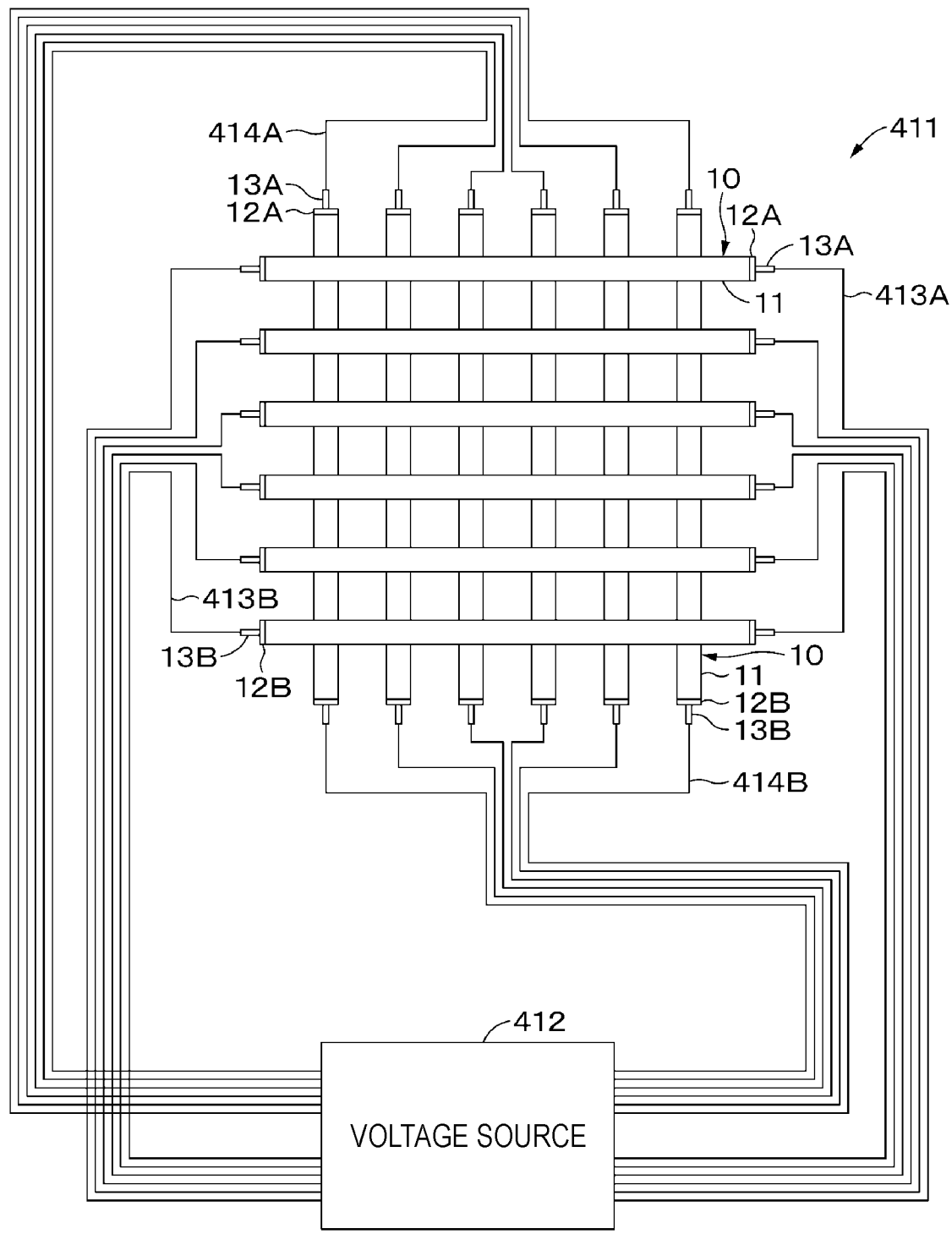
FIG. 14 is a schematic diagram illustrating another example of a configuration of a tactile sense presenting device as an application example.

Another example in which the present technology is applied to a tactile sense presenting device is described with reference to FIG. 14. The tactile sense presenting device is an example of a driving device, and is provided with an actuator array 411, a voltage source 412, and a control unit not illustrated. Note that, in this application example, a portion similar to that in the first embodiment is assigned with the same reference sign and the description thereof is omitted.

The actuator array 411 is an example of a driving member, and is provided with a plurality of actuators 10 having a fiber shape, and the plurality of actuators 10 is two-dimensionally arranged in a mesh pattern. Specifically, the actuator array 320 is provided with actuators 10 of a first group having a fiber shape, and actuators 10 of a second group having a fiber shape superimposed on the actuators 10 of the first group.

The actuators 10 of the first group are arranged in line at a predetermined interval such that the longitudinal direction of the actuators 10 is in a first direction and peripheral surfaces of the adjacent actuators 10 face each other. The actuators 10 of the second group are arranged in line at a predetermined interval such that the longitudinal direction of the actuators 10 is in a second direction intersecting with (for example, orthogonal to) the first direction and the peripheral surfaces of the adjacent actuators 10 face each other.

The terminals 13A and 13B of the actuators 10 of the first group are connected to the voltage source 412 via wiring 413A and wiring 413B, respectively. The terminals 13A and 13B of the actuators 10 of the second group are connected to the voltage source 412 via wiring 414A and wiring 414B, respectively.

The voltage source 412 supplies a driving voltage of a predetermined frequency to each actuator 310 on the basis of a control signal from the control unit not illustrated.

Variation

The actuator array 320 may be provided with any one of the actuator 10 according to the variation of the first embodiment, the actuator 110 according to the second embodiment and the variation thereof, and the actuator 210 according to the third embodiment and the variation thereof in place of the actuator 10 according to the first embodiment.

6 Application Example

Configuration of Linear Driving Device

Figure 15:
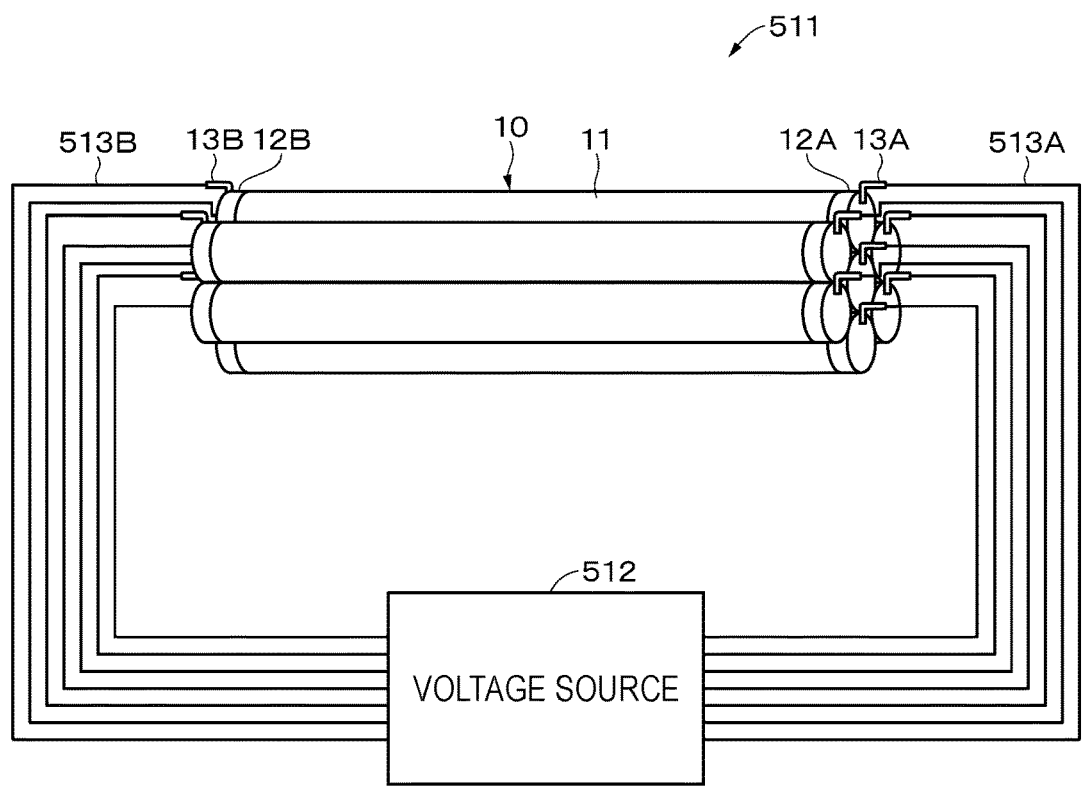
FIG. 15 is a schematic diagram illustrating an example of a configuration of a linear driving device as an application example.

An example in which the present technology is applied to a linear driving device is described with reference to FIG. 15. The linear driving device is an example of a driving device, and is provided with an actuator group 511 having a columnar shape, a voltage source 512, and a control unit not illustrated. Note that, in this application example, a portion similar to that in the first embodiment is assigned with the same reference sign and the description thereof is omitted.

The actuator group 511 is an example of a driving member, and is provided with a plurality of actuators 10 having a bar-shape, and the plurality of actuators 10 is bundled by a holding member not illustrated. As the holding member, for example, a shrinking ring-shaped member, a shrinking sticky tape, or a shrinking tubular member which houses the plurality of actuators 10 may be used. A shape of the tubular member is not particularly limited, but a cylindrical shape or a rectangular cylindrical shape may be exemplified.

The terminals 13A and 13B are connected to the voltage source 512 via wiring 513A and wiring 513B, respectively. The voltage source 512 supplies a driving voltage to each actuator 310 on the basis of a control signal from the control unit not illustrated.

Figure 16:
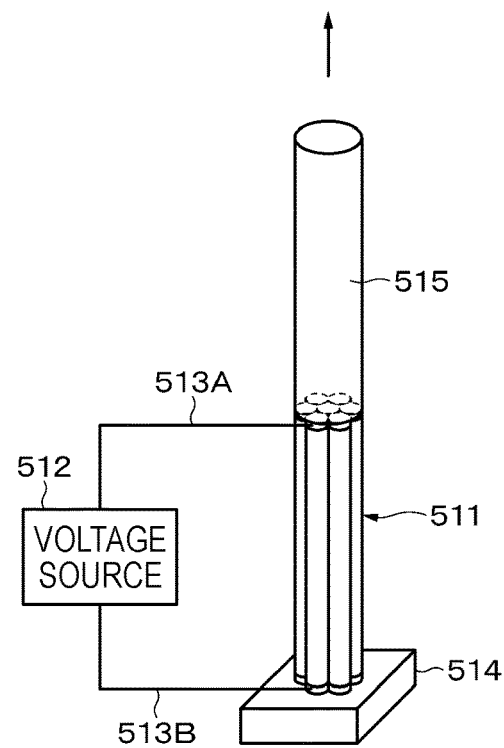
FIG. 16 is a perspective view illustrating another example of a configuration of a linear driving device as an application example.

The linear driving device may further be provided with a support body 514 which supports one end of the actuator group 511 and a columnar fixing member 515 fixed to the other end of the actuator group 511, as illustrated in FIG. 16.

Operation of Linear Driving Device

The linear driving device having the above-described configuration operates as follows. In other words, when a driving voltage is applied to the actuator 10, the actuator group 511 is extended. Furthermore, when the driving voltage applied to the actuator 10 is released, the actuator group 511 is contracted.

Variation

The actuator group 511 may be provided with any one of the actuator 10 according to the variation of the first embodiment, the actuator 110 according to the second embodiment and the variation thereof, and the actuator 210 according to the third embodiment and the variation thereof in place of the actuator 10 according to the first embodiment.

7 Application Example

Configuration of Joint Driving Device

Figure 17:
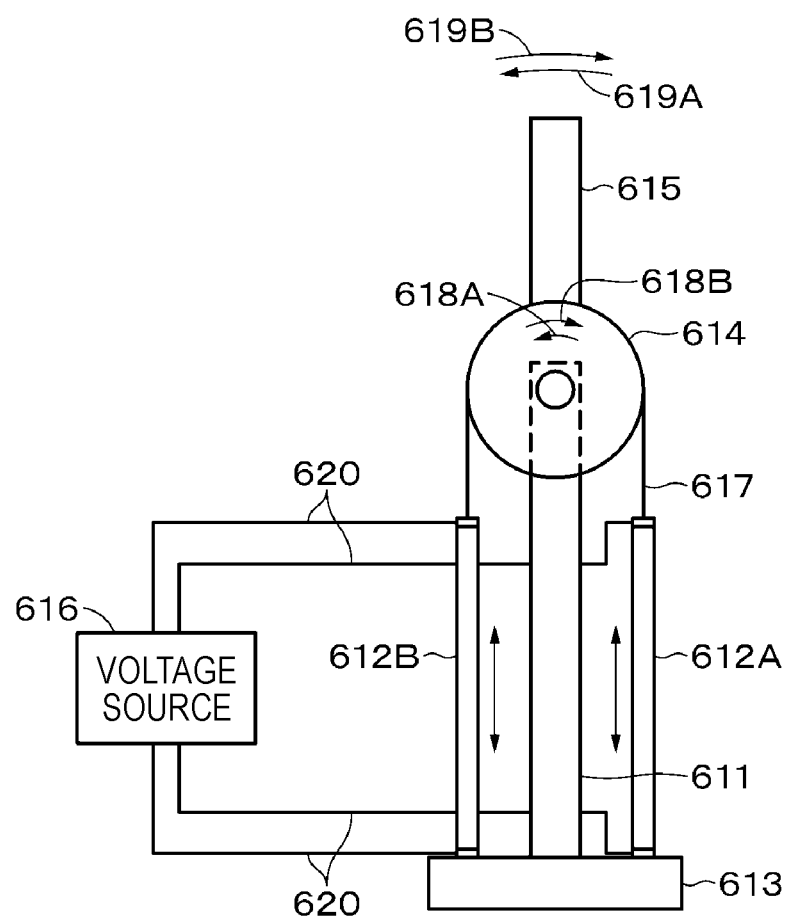
FIG. 17 is a side view illustrating an example of a configuration of a joint driving device.

An example in which the present technology is applied to a joint driving device is described with reference to FIG. 17. The joint driving device is an example of a driving device, and is provided with a columnar body 611, a pair of actuators 612A and 612B, a support body 613 which supports one end of the columnar body 611 and the actuators 612A and 612B, a rotating body 614 rotatably supported by the other end of the columnar body 611, a driving unit 615 supported by the rotating body 614, a voltage source 616, and a control unit not illustrated.

A linear member 617 such as a wire is stretched around a peripheral surface of the rotating body 614. One end of the linear member 617 is connected to the other end of the actuator 612A, and the other end of the linear member 617 is connected to the other end of the actuator 612B. The rotating body 614 is rotatable via the linear member by expansion and contraction of the actuators 612A and 612B. The voltage source 616 is electrically connected to the actuators 612A and 612B via wiring 620, and supplies a driving voltage to the actuators 612A and 612B on the basis of a control signal from the control unit not illustrated.

The actuators 612A and 612B are any one of the actuator 10 according to the first embodiment and the variation thereof, the actuator 110 according to the second embodiment and the variation thereof, and the actuator 210 according to the third embodiment and the variation thereof.

Operation of Joint Driving Device

The linear driving device having the above-described configuration operates as follows. In other words, when the driving voltage is controlled to extend the actuator 612A and contract the actuator 612B, the rotating body 614 rotates in a direction indicated by arrow 618A via the linear member 617. As a result, the driving unit 615 drives in a direction indicated by arrow 619A. On the other hand, when the driving voltage is controlled to contract the actuator 612A and extend the actuator 612B, the rotating body 614 rotates in a direction indicated by arrow 618B via the linear member 617. As a result, the driving unit 615 drives in a direction indicated by arrow 619B.

Although the embodiments and the application examples thereof of the present technology are specifically described above, the present technology is not limited to the above-described embodiments and application examples and various modifications based on the technical idea of the present technology may be made.

For example, the configuration, method, step, shape, material, numerical value and the like described in the above-described embodiments and application examples are merely examples, and the configuration, method, step, shape, material, numerical value and the like different from those may also be used as needed.

Furthermore, the configuration, method, step, shape, material, numerical value and the like of the above-described embodiments and application examples thereof may be combined with one another within the gist of the present technology.

Furthermore, the present technology may also adopt the following configurations.

(1)
An actuator including:
a laminate including an elastomer layer and an electrode, in which the laminate has a spiral or concentric shape,
pre-distortion is applied to at least one member out of the elastomer layer and the electrode, and
area distortion of the at least one member is 10% or larger.

(2)
The actuator according to (1), in which a stress ratio (A:B) between a stress A in an axial direction and a stress B in a circumferential direction of the laminate is 1:2.

(3)
The actuator according to (1) or (2), in which the area distortion of the at least one member is 50% or larger.

(4)
The actuator according to any one of (1) to (3), in which the pre-distortion is applied in an axial direction and a circumferential direction of the laminate.

(5)
The actuator according to (4), in which a contraction force in the axial direction and a contraction force in the circumferential direction of the laminate are balanced.

(6)
The actuator according to any one of (1) to (5),
in which a Young's modulus of the elastomer layer is 10 MPa or smaller, and
breaking distortion of the elastomer layer is 50% or larger.

(7)
The actuator according to any one of (1) to (6), in which at least one member out of the elastomer layer and the electrode has a multilayer structure.

(8)
The actuator according to (7), in which a surface layer of the member having the multilayer structure has stickiness.

(9)
The actuator according to any one of (1) to (7), in which at least one member out of the elastomer layer and the electrode has a sticky surface.

(10)
The actuator according to any one of (1) to (9), further including:
a winding stop member which stops winding the laminate having a spiral shape.

(11)
The actuator according to any one of (1) to (10), further including:
a tubular housing member which houses the laminate having a spiral shape.

(12)
The actuator according to any one of (1) to (11), in which one end on an outermost circumferential side of the laminate having a spiral shape is stopped winding by adhesion.

(13)
The actuator according to any one of (1) to (12), in which the actuator is spirally twisted.

(14)
The actuator according to any one of (1) to (13), in which the actuator has a fiber shape.

(15)
A driving member including: a plurality of the actuators according to any one of (1) to (14).

(16)
The driving member according to (15), in which the plurality of actuators is bundled.

(17)
The driving member according to (15), in which the plurality of actuators is arranged in line such that axial directions of the plurality of actuators are in a same direction, and peripheral surfaces of adjacent actuators face each other.

(18)
The driving member according to (15), in which the plurality of actuators is arranged in a mesh pattern.

(19)
A tactile sense presenting device including: the actuator according to any one of (1) to (14).

(20)
A driving device including: the actuator according to any one of (1) to (14).

REFERENCE SIGNS LIST

10, 110, 210, 220 Actuator
11, 111, 211, 221 Wound body (actuator main body)

11SA, 11SB, 111SA, 111SB End face
11DA Axial direction
11DB Circumferential direction
12A, 12B, 112A, 112B Extracting electrode
13A, 13B Terminal
14 Winding stop member
15 Housing member
16 Adhesive
21, 22, 121, 122 Electrode sheet
21A, 22A Elastomer layer
21B, 22B, 121B, 122B Electrode
121C, 122C Main body portion
121D, 122D Extended portion
311, 411 Actuator array
312, 412, 512, 616 Voltage source
511 Actuator group

The invention claimed is:

1. An actuator comprising:
   a laminate including an elastomer layer and an electrode,
   wherein the laminate has a spiral or concentric shape,
   pre-distortion is applied to at least one member out of the elastomer layer and the electrode, and
   area distortion of the at least one member is 10% or larger, and
   wherein a Young's modulus of the elastomer layer is from 0.05 MPa to 10 MPa.

2. The actuator according to claim 1, wherein a stress ratio (A:B) between a stress A in an axial direction and a stress B in a circumferential direction of the laminate is 1:2.

3. The actuator according to claim 1, wherein the area distortion of the at least one member is 50% or larger.

4. The actuator according to claim 1, wherein the pre-distortion is applied in an axial direction and a circumferential direction of the laminate.

5. The actuator according to claim 4, wherein a contraction force in the axial direction and a contraction force in the circumferential direction of the laminate are balanced.

6. The actuator according to claim 1,
   wherein breaking distortion of the elastomer layer is 50% or larger.

7. The actuator according to claim 1, wherein at least one member out of the elastomer layer and the electrode has a multilayer structure.

8. The actuator according to claim 7, wherein a surface layer of the member having the multilayer structure has stickiness.

9. The actuator according to claim 1, wherein at least one member out of the elastomer layer and the electrode has a sticky surface.

10. The actuator according to claim 1, further comprising:
    a winding stop member which stops winding the laminate having a spiral shape.

11. The actuator according to claim 1, further comprising:
    a tubular housing member which houses the laminate having a spiral shape.

12. The actuator according to claim 1, wherein one end on an outermost circumferential side of the laminate having a spiral shape is stopped winding by adhesion.

13. The actuator according to claim 1, wherein the actuator is spirally twisted.

14. The actuator according to claim 1, wherein the actuator has a fiber shape.

15. A driving member comprising: a plurality of the actuators according to claim 1.

16. The driving member according to claim 15, wherein the plurality of actuators is bundled.

17. The driving member according to claim 15, wherein the plurality of actuators is arranged in line such that axial directions of the plurality of actuators are in a same direction, and peripheral surfaces of adjacent actuators face each other.

18. The driving member according to claim 15, wherein the plurality of actuators is arranged in a mesh pattern.

19. A tactile sense presenting device comprising: the actuator according to claim 1.

20. A driving device comprising: the actuator according to claim 1.

* * * * *